(12) United States Patent
Shirakawa et al.

(10) Patent No.: US 7,208,918 B2
(45) Date of Patent: Apr. 24, 2007

(54) VEHICLE ROTATING ELECTRIC MACHINE

(75) Inventors: Shinji Shirakawa, Hitachi (JP);
Mutsuhiro Mori, Mito (JP);
Masamitsu Inaba, Hitachi (JP);
Tatsumi Yamauchi, Hitachiota (JP);
Masahiro Iwamura, Hitachi (JP);
Keiichi Mashino, Hitachinaka (JP);
Masanori Tsuchiya, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 127 days.

(21) Appl. No.: 11/102,627

(22) Filed: Apr. 11, 2005

(65) Prior Publication Data

US 2005/0237033 A1 Oct. 27, 2005

(30) Foreign Application Priority Data

Apr. 12, 2004 (JP) ............................. 2004-117027
Feb. 10, 2005 (JP) ............................. 2005-033760

(51) Int. Cl.
*H02P 9/00* (2006.01)
*H02M 5/42* (2006.01)

(52) U.S. Cl. ............................. 322/99; 322/24; 322/28; 323/303; 363/89

(58) Field of Classification Search .................. 322/22, 322/23, 24, 37, 28, 90, 99; 323/303, 269; 363/89, 55
See application file for complete search history.

(56) References Cited

U.S. PATENT DOCUMENTS 4,831,322 A * 5/1989 Mashino et al. .............. 322/28
5,093,611 A * 3/1992 Nakamura et al. ............ 322/90
5,543,703 A * 8/1996 Kusase et al. ................ 322/16
6,049,108 A 4/2000 Williams et al.
6,456,514 B1 * 9/2002 Perreault et al. .............. 363/89
6,465,996 B2 * 10/2002 Nagata et al. ............... 323/303
6,504,346 B2 * 1/2003 Nakamura et al. ............ 322/90
2002/0101217 A1 8/2002 Hosoda et al.

FOREIGN PATENT DOCUMENTS

| DE | 10211463 B3 | 1/2004 |
|---|---|---|
| EP | 0391386 A2 | 10/1990 |
| EP | 1460749 A1 | 9/2004 |
| JP | 06-225476 | 8/1994 |
| JP | 07-075262 | 3/1995 |
| JP | 11-150886 | 6/1999 |
| JP | 2002-089417 | 3/2002 |
| JP | 2003-070256 | 3/2003 |
| JP | 2003-217647 A | 7/2003 |

OTHER PUBLICATIONS

European Search Report Issued on Sep. 20, 2006, in related application EP 05 00 7951.

* cited by examiner

*Primary Examiner*—Nicholas Ponomarenko
(74) *Attorney, Agent, or Firm*—Crowell & Moring LLP

(57) ABSTRACT

An inverter device is mounted on the rotating electric machine body The inverter device includes a module unit having a converter circuit and a control unit that controls the operation of the converter circuit. The converter circuit is configured by connecting a plurality of the following series circuits in parallel, each of the series circuits includes a P-channel MOS semiconductor device disposed at a higher potential side and an N-channel MOS semiconductor device disposed at a lower potential side which are electrically connected in series. An electric power that is supplied from a battery or an electric power that is supplied to the battery is controlled.

11 Claims, 14 Drawing Sheets

(1) COMBINATION OF N-MOS AND N-MOS (2) COMBINATION OF P-MOS AND N-MOS

VEHICLE ROTATING ELECTRIC MACHINE

CLAIM OF PRIORITY

The present application claims priority from Japanese application serial no. 2004-117027, filed on Apr. 12, 2004, and serial no. 2005-033760, filed on Feb. 10, 2005, the contents of which are hereby incorporated by references into this application.

BACKGROUND OF THE INVENTION

The present invention relates to a vehicle rotating electric machine to be mounted on a vehicle.

For the purpose of improving fuel consumption and reducing an exhaust emission including carbon dioxide, in vehicles, there has been proposed an idling stop system for stopping an engine temporarily when the automobile are stopping such as waiting at a red light. The idling stop system provides an engine start system including, for example, a motor and an inverter device, separately from a starter. In this type, the motor is disposed in proximity to the engine, and transmits a driving force to the engine through a clutch and a belt at the time of restarting the engine. On the other hand, since the inverter device has a large number of electronic parts that are low in the durability at high temperature, it is necessary that the inverter device is separated and arranged at a position that avoids a high temperature environment in the vicinity of the engine. For that reason, additional parts such as the inverter device and the electric cable that connects the inverter device and the motor are disposed within an engine room having a limited space, and the idling stop system cannot be mounted without changing the layout of the interior of the engine room.

From the above viewpoint, a motor and an inverter device able to be simply mounted and low in the costs have been demanded for spread of the idling stop system. As one solution to the above demand, there has been proposed an alternator (hereinafter also referred to as "inverter built-in alternator") which is equipped with a three-phase bridge converter circuit using MOS (metal oxide semiconductor) elements and a control circuit for the three-phase bridge converter circuit to enable motor drive. The inverter built-in alternator has an Inverter circuit in which a rectifier diode of a normal vehicle alternator is replaced by a MOS element. Since the inverter built-in alternator can be realized by the substantially same size as that of the normal vehicle alternator, the idling stop system can be realized without remarkably changing the layout of the interior of the engine room even in a small vehicle having a limited mounting space. Documents of the prior arts are as follows.

[Document 1] Japanese Patent Laid-Open No. 2002-89417

[Document 2] Japanese Patent Laid-Open No. H6(1994)-225476

[Document 3] Japanese Patent Laid-Open No. H7(1995)-75262

[Document 4] Japanese Patent Laid-Open No. 2003-70256

In the inverter circuit equipped in the inverter built-in alternator, downsizing of the device and having the durability at a high temperature are required to enable to arrange the device concerning the inverter in a high temperature environment in the vicinity of the engine. However, because the conventional large current output inverter has the three-phase bridge converter circuit made up of an N-channel MOSFET (metal oxide semiconductor field effect transistor) which is low in the on-resistance, there is provided a wiring layout in which the MOSFET at the higher side and the MOSFET at the lower side are connected to conductor plates that are different in the potential. As a result, because the two conductor plates thus insulated are required, the inverter circuit is prevented from being downsized. Also, because the potential of the output terminal of the bridge circuit fluctuates roughly from the power potential to the ground potential according to the on/off states of the semiconductor switches at the higher side and the lower side, a power supply that provides a reference potential as the output terminal potential is required in the driver circuit of the MOSFET at the higher side in each of the phases (refer to FIG. 15). A large-capacity electrolytic capacitor is essential for the power supply of the driver circuit of the high-side MOSFET in order to hold the voltage. However, the electrolytic capacitor is larger in the volume than other electronic parts, and has such a characteristic that the electrostatic capacity is reduced and the deterioration such as an increase of the internal resistor is liable to occur under the high temperature environment. As a result, it is difficult to realize the inverter built-in alternator that requires the downsizing and the high-temperature durability in the inverter circuit that requires the electrolytic capacitor.

Also, the inverter built-in alternator requires the driver circuit, the minimum control circuits, a protector circuit and power supplies for those circuits in addition to the field current control circuit that is equipped in the conventional alternator having only a power generating function. However, in the case where the respective circuits are made up of the individual parts, it is very difficult from the viewpoint of sizes to realize that those circuits are equipped in the inverter built-in alternator. In addition, there is required that each of those circuits is made up of a circuit or a power supply which does not require the electrolytic capacitor from the viewpoint of the high-temperature resistant durability.

SUMMARY OF THE INVENTION

The present invention provides a vehicle rotating electric machine that is capable of realizing that a power converter device is mounted on a rotating electric machine body by about the same built-structure as the conventional one.

In order to provide the vehicle rotating electric machine, the present invention improves the property of mounting the power converter device onto the rotating electric machine body. As one of specific solving means, the power control circuit is configured by connecting a plurality of the following series circuits in parallel, each of the series circuits includes a P-channel MOS semiconductor device disposed at a higher potential side and an N-channel MOS semiconductor device disposed at a lower potential side which are electrically connected in series.

Also, the present invention integrates a plurality of electronic circuit elements that constitute a control circuit and a driver circuit in a control unit that controls the operation of the power control circuit.

According to the present invention, since the inverter device can be downsized, there can be realized the vehicle rotating electric machine in which the inverter device is mounted on the rotating electric machine body by the substantially about same size as that of the general vehicle alternator. As a result, even in the small vehicle having a limited mounted space, the idling stop function can be provided without remarkably changing the layout of the interior of an engine room.

DETAILED DESCRIPTION OF THE INVENTION

Hereinafter, embodiments of the present invention will be described with reference to FIGS. 1 to 11. A motor-alternator 100 according to an embodiment of the present invention is a so-called inverter built-in vehicle rotating electric machine in which an inverter device 50 is integrated with a rotating electric machine body 1, and constitutes an electric power train of an automobile 200.

Figure 10:
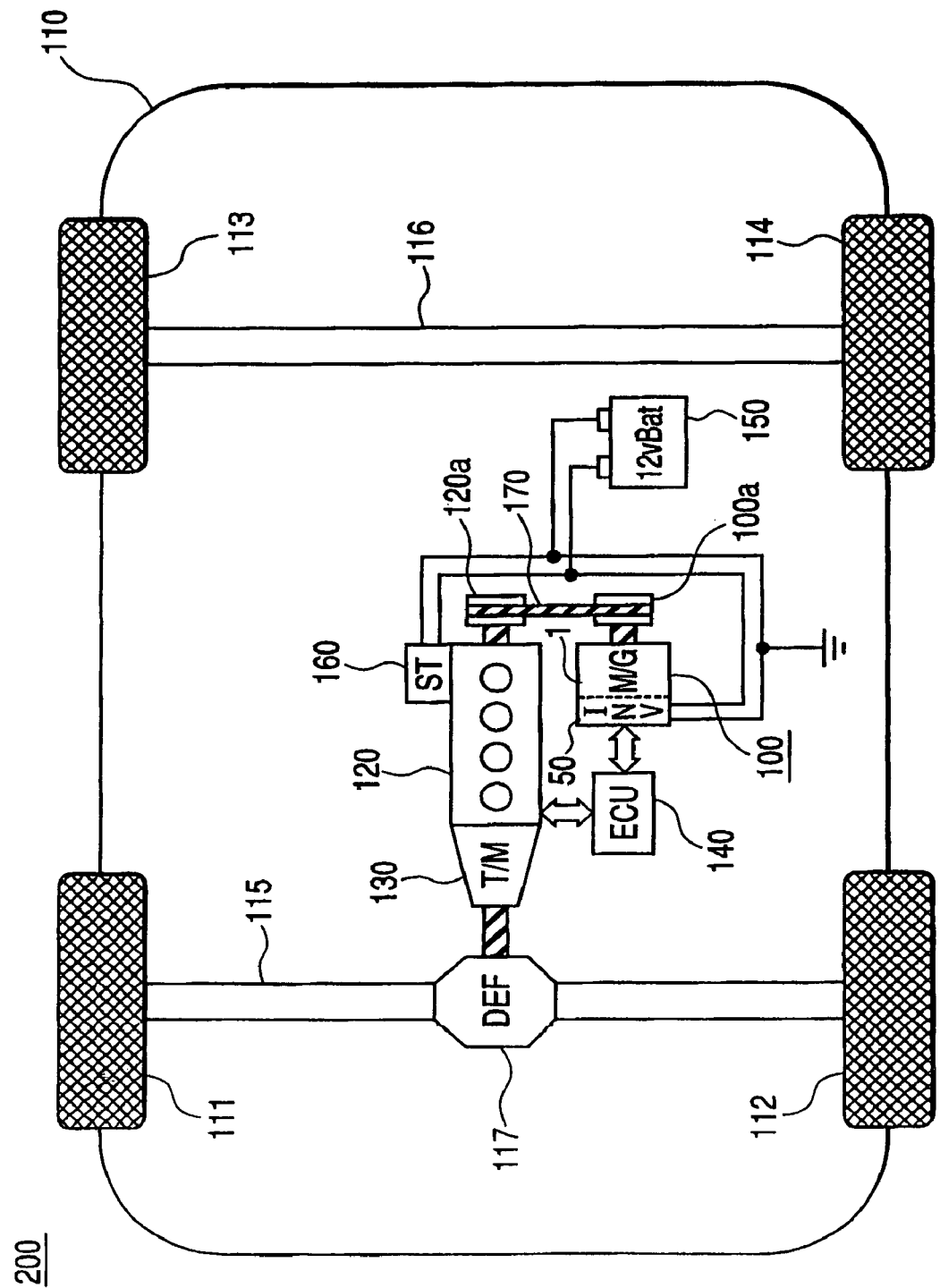
FIG. 10 is a block diagram showing the structure of a power train of an automobile on which the motor-alternator that is the embodiment of the present invention is mounted.

The automobile 200 to which the motor-alternator 100 of the present invention is applied is a so-called hybrid automobile having both of an engine power train with an internal combustion engine as a power source and an electric power train with the motor-alternator 100 as a power source, as shown in FIG. 10. The engine power train is mainly used for a driving power source of the automobile 200. The electric power train is mainly used for the power source to make starting of the engine 120, and used for the electric power supply for the automobile 200. The automobile 200 having such an electric power train, when the automobile stops such that the automobile waits at a red light in a state where the ignition key is on, the engine 120 automatically stops, and when the automobile starts, the electric power train automatically makes the engine start for starting of the vehicle. Thereby the automobile makes it possible to perform so-called idling stop driving which enables the fuel consumption of the automobile 200 to be improved and the exhaust emission to be reduced.

As shown in FIG. 10, a front axle 115 is rotatably supported at a front side of a vehicle body. Front wheels 111 and 112 are disposed at both ends of the front axle 115. A rear axle 116 is rotatably supported at a rear side of the vehicle body. Rear wheels 113 and 114 are disposed at both ends of the rear axle 116. A differential gear 117 that is a power sharing mechanism is disposed in the center of the front axle 115. The differential gear 117 shares a rotational driving force, which has been transmitted through a transmission 130 from the engine 120, to the right and left axle members of the front axle 115. The transmission 130 varies the rotational driving force of the engine 120 and transmits the varied driving force to the differential gear 117. The driving of the engine 120 is controlled by controlling the operations of accessories such as an injector that is a fuel control mechanism and a throttle valve that is an air flow rate control mechanism with an engine control device 140.

The motor-alternator 100 is arranged within the engine room at the front of the vehicle body 110 together with the engine 120, and mounted to the side of the engine 120 and mechanically connected to the engine 120. The mechanical connection can be realized by looping a belt 170 over a pulley 120a disposed on a crank shaft of the engine 120 and a pulley 100a disposed on the rotary shaft of the motor-alternator 100. As a result, the motor-alternator 100 can transmit the rotational driving force to the engine 120, and can receive the rotational driving force from the engine 120.

Figure 4:
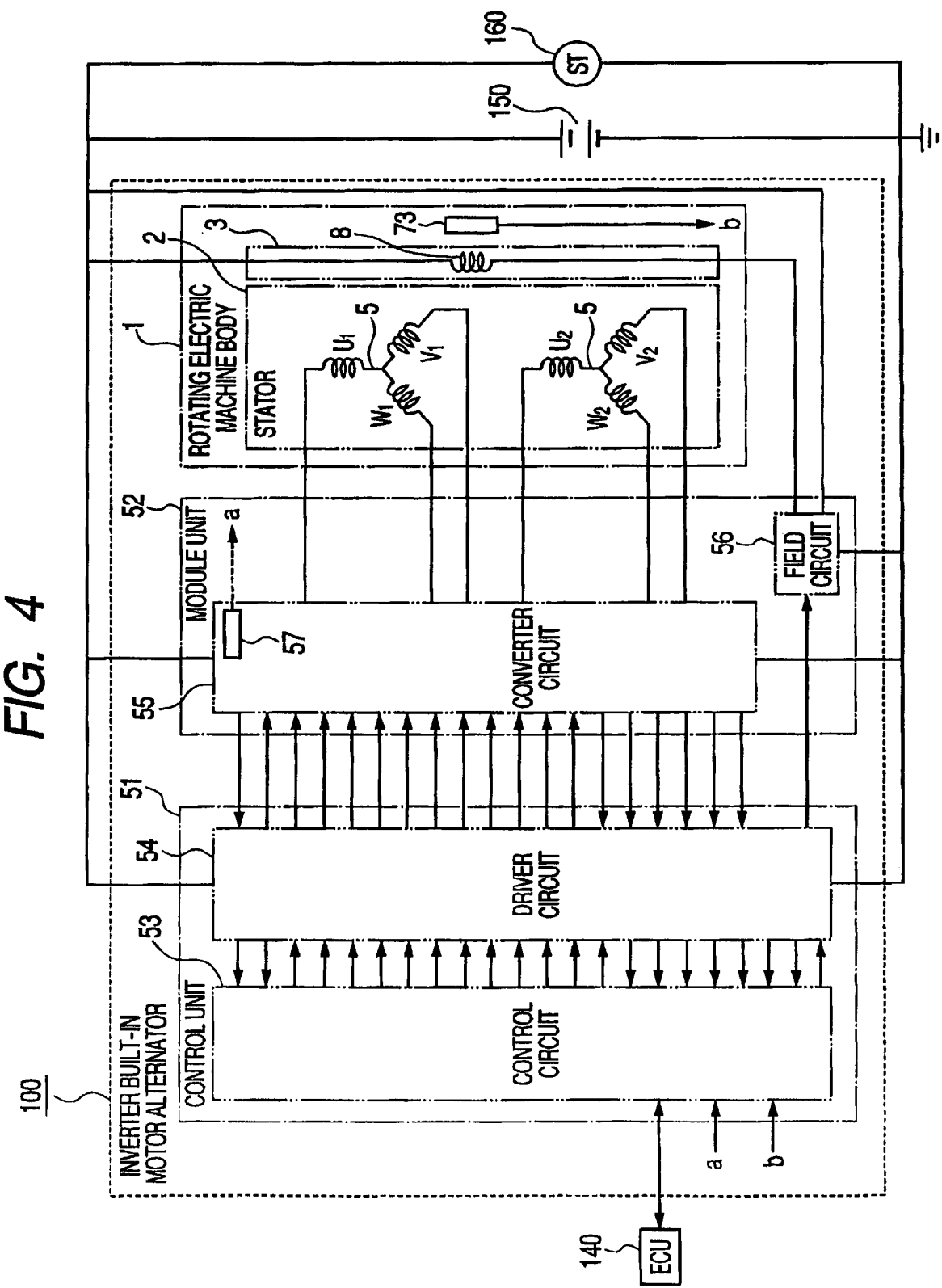
FIG. 4 is a block diagram showing the system structure of the motor-alternator according to the embodiment of the present invention.

The electric power train of the automobile 200 is electrically connected to a 14 V vehicle power supply comprising a battery 150 as shown in FIGS. 4 and 10, and gives a power generated by itself to the battery or receives a power from the 14 V vehicle power supply. The 14 V vehicle power supply is electrically connected with a starter as a starting device of the engine 120, and vehicle accessories machinery such as lamps, a car radio, and direction indicators not shown. A lead battery of an output voltage of about 12 V is used for the battery 150.

Figure 3:
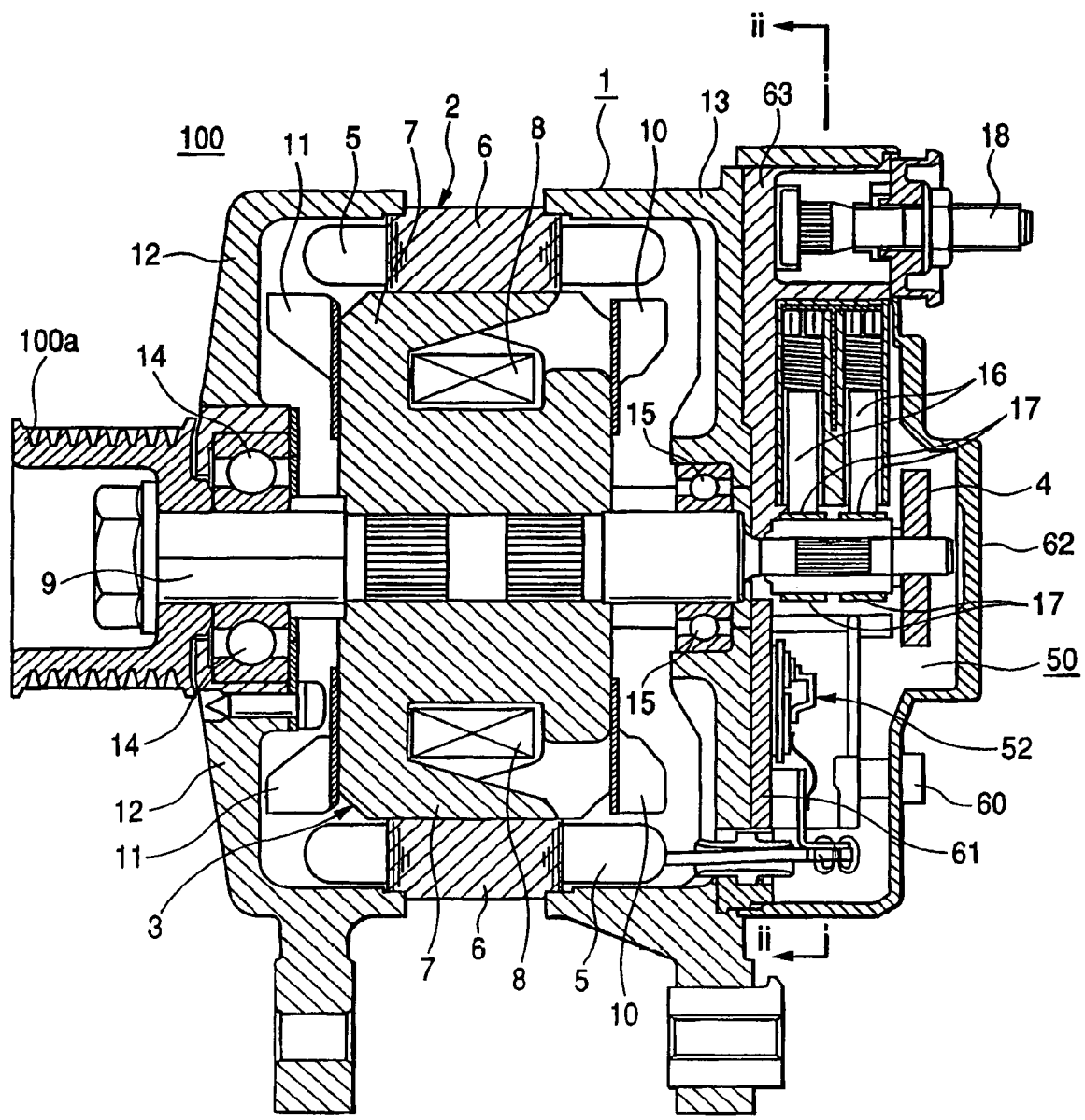
FIG. 3 is a cross-sectional view showing the entire structure of the motor-alternator according to the embodiment of the present invention.

As described above, the motor-alternator 100 is structured such that the inverter device 50 is integrated with the rotating electric machine 1. In the motor-alternator 100, the rotating electric machine 1 is made up in common with conventional alternators mounted on the automobile as shown in FIG. 3. More specifically, the rotating electric machine 1 comprises a stator 2 having a stator winding 5 and a rotor 3 having a field winding 8 as shown in FIG. 4. A specific structure of the rotating electric machine body 1 will be described later with reference to FIG. 3. A three-phase alternating power, which is controlled by the inverter device 50, is supplied to the stator winding 5. A field current, which is also controlled by the inverter device 50, is supplied to the field winding 8. In the motor-alternator 100, a rotating magnetic field is generated by such three-phase alternating power and field current, and the rotor 3 rotates with respect to the stator 2. As a result, the motor generator 100 operates as an electric motor, and generates a rotational driving force for starting the engine 120. On the other hand, in the motor-alternator 100, when a field current is supplied to the field winding 8, and the rotor 3 rotates by the rotational driving force of the engine 120, a voltage is induced in the stator winding 5. As a result, the motor-alternator 100 operates as an alternator, and generates a three-phase alternating power to charge the battery 150. In this embodiment a synchronous alternating rotating electric machine is used for the motor-alternator 100. However, an inductive alternating rotating electric machine may be used as the motor-alternator 100.

The inverter device 50 is a power converter device that converts a DC power supplied from the battery 150 into a three-phase AC power, or converts a three-phase AC power obtained by the power generation of the motor-alternator 100 into a DC power. More specially, the inverter device 50 comprises a module unit 52 and a control unit 51 as shown in FIG. 4. The mounting structure of the inverter device 50 will be described later with reference to FIG. 1. The module unit 52 has a converter circuit 55 and a field circuit 56. The converter circuit 55 is a power control circuit that converts a DC power supplied from the battery 150 into a three-phase AC power, or converts a three-phase AC power supplied from the stator winding 5 into a DC power. The field circuit 56 is a field current control circuit that controls the field current supplied to the field winding 8 from the battery 150. The control unit 51 has a control circuit 53 and a driver circuit 54. The control circuit 53 is a control logic circuit that outputs, to the driver circuit 54, command signals to control the operation of the converter circuit 55 and the field circuit 56 according to a command signal from a host control device, for example, the engine control device 140, and various detection signals (feedback signals) related to a phase voltage of the motor-alternator 100 or the terminal voltage of the battery 150. Upon receiving the command signal from the control circuit 53, the driver circuit 54 outputs the driving signals to operate the converter circuit 55 and the field circuit 56 to the converter circuit 55 and the field circuit 56. In order to improve the mounting property of the inverter device 50 on the rotating electric machine body 1, in this embodiment, a voltage adjuster that has been mounted on the vehicle alternator up to now is integrated with the inverter device 50 to ensure a space where which the inverter deice 50 Is mounted.

The respective structures of the control circuit 53, the driver circuit 54, the converter circuit 55 and the field circuit 56 in the inverter device 50 will be described in more detail.

Figure 7:
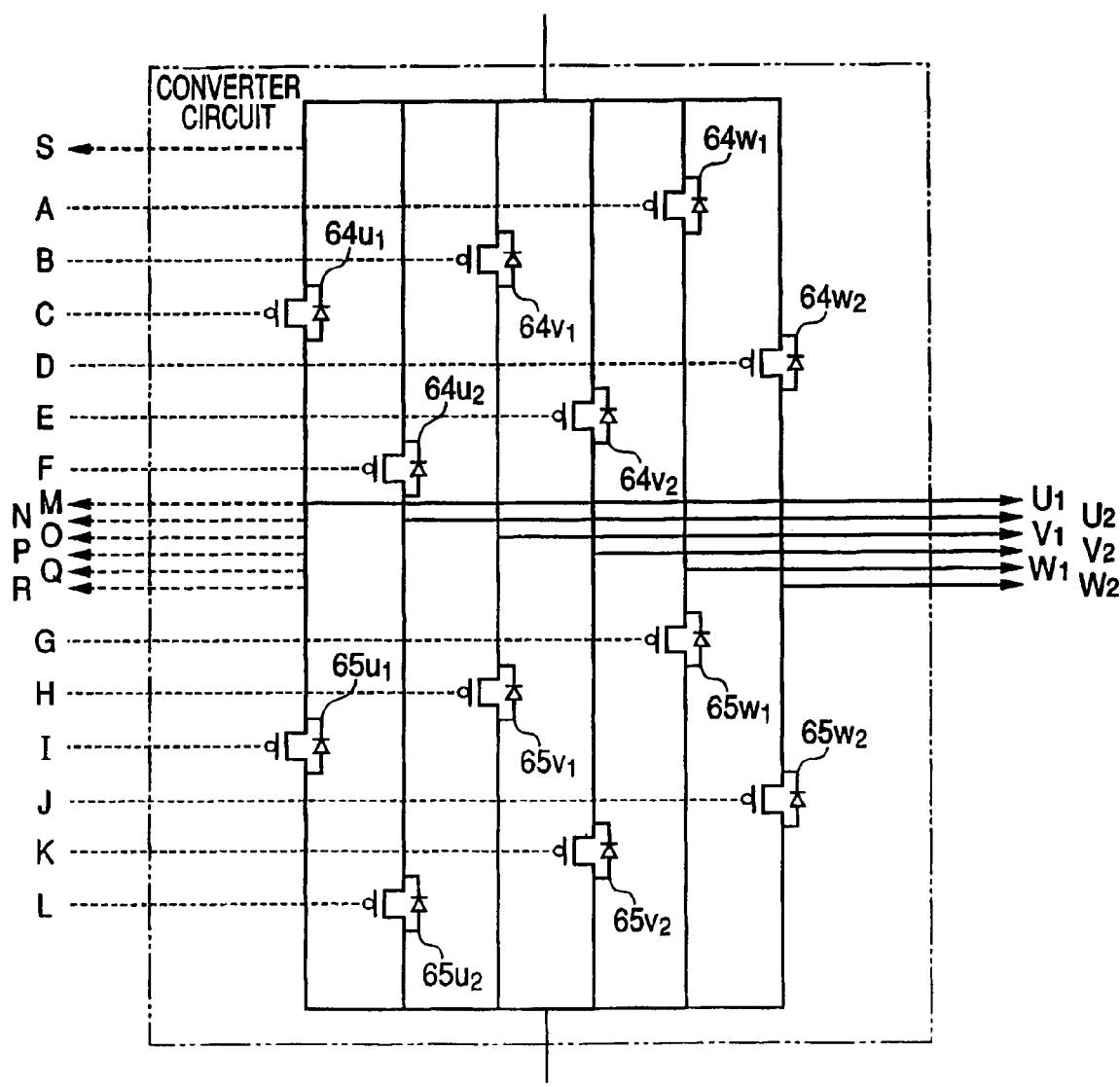
FIG. 7 is a block diagram showing the circuit structure of a converter circuit shown in FIG. 4.
Figure 8:
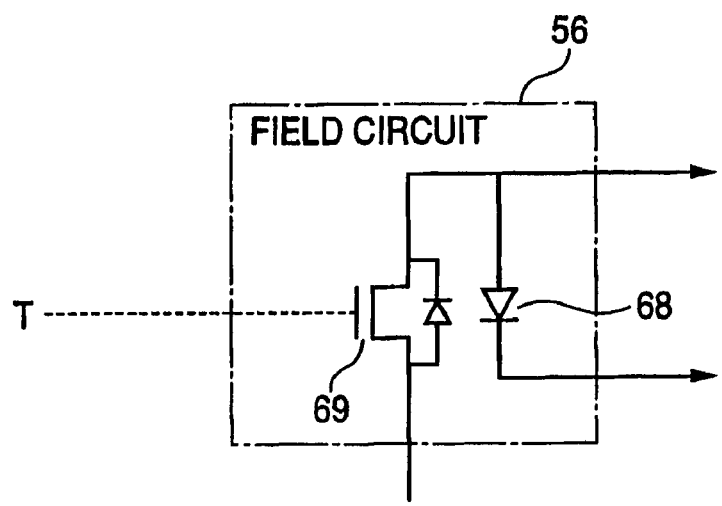
FIG. 8 is a block diagram showing the circuit structure of a field circuit shown in FIG. 4.

The converter circuit 55 converts the DC power into the three-phase AC power or the three-phase AC power into the DC power by the switching (on/off) operation of the switching semiconductor device. The switching semiconductor device may be MOSFETs (MOS field effect transistor) that are MOS (metal oxide semiconductor) elements, or an IGBT (insulated gate bipolar transistor). In this embodiment, MOSFETs in which respective diodes are incorporated are used for the switching semiconductor device. As shown in FIG. 7, the converter circuit 55 is configured with a bridge circuit of 6 phases (3 phases×the number of stator windings: 2) in which each thereof has a P-channel MOSFET and a N-channel MOSFET. In each (arms) of the 6 phases, a drain electrode of the P-channel MOSFET 64 and a drain of the N-channel MOSFET 65 are electrically connected to each other in series, on condition that the P-channel MOSFET 64 is disposed at a higher potential pole (positive pole) side, and the N-channel MOSFET 64 is disposed at a lower potential pole(negative pole) side. And by connecting the respective phases (series circuits; arms) to each other in parallel, the bridge circuit of 6 Phases is configured for converter. A source electrode of the P-channel MOSFET 64 is electrically connected to the higher potential pole (positive pole) side in both poles of the battery 150. A source electrode of the N-channel MOSFET 65 is electrically connected to the lower potential pole (negative pole) side in both poles of the battery 150. Phase windings of the stator winding 5 respectively are electrically connected between the drain electrodes of the P-channel MOSFET 64 and the N-channel MOSFET 65. That is, a U-phase winding on one side of the stator winding 5 is electrically connected between the drain electrodes of the P-channel MOSFET $64U_1$ and the N-channel MOSFET $65U_1$. A U-phase winding on the other side of the stator winding 5 is electrically connected between the drain electrodes of the P-channel MOSFET $64U_2$ and the N-channel MOSFET $65U_2$. The same structure as the U phase is applied to a V-phase and a W-phase. Corresponding driving signals A to L are inputted from the control unit 51 to the gate electrodes of the P-channel MOSFET 64 and the N-channel MOSFET 65. A voltage between the drain electrodes of the P-channel MOSFET 64 and the N-channel MOSFET 65 is inputted to the control unit 51 as a phase voltage signal. A voltage at a higher potential pole (positive pole) side in both poles of the battery 150 is inputted to the control unit 51 as a battery positive pole voltage signal.

Figure 5:
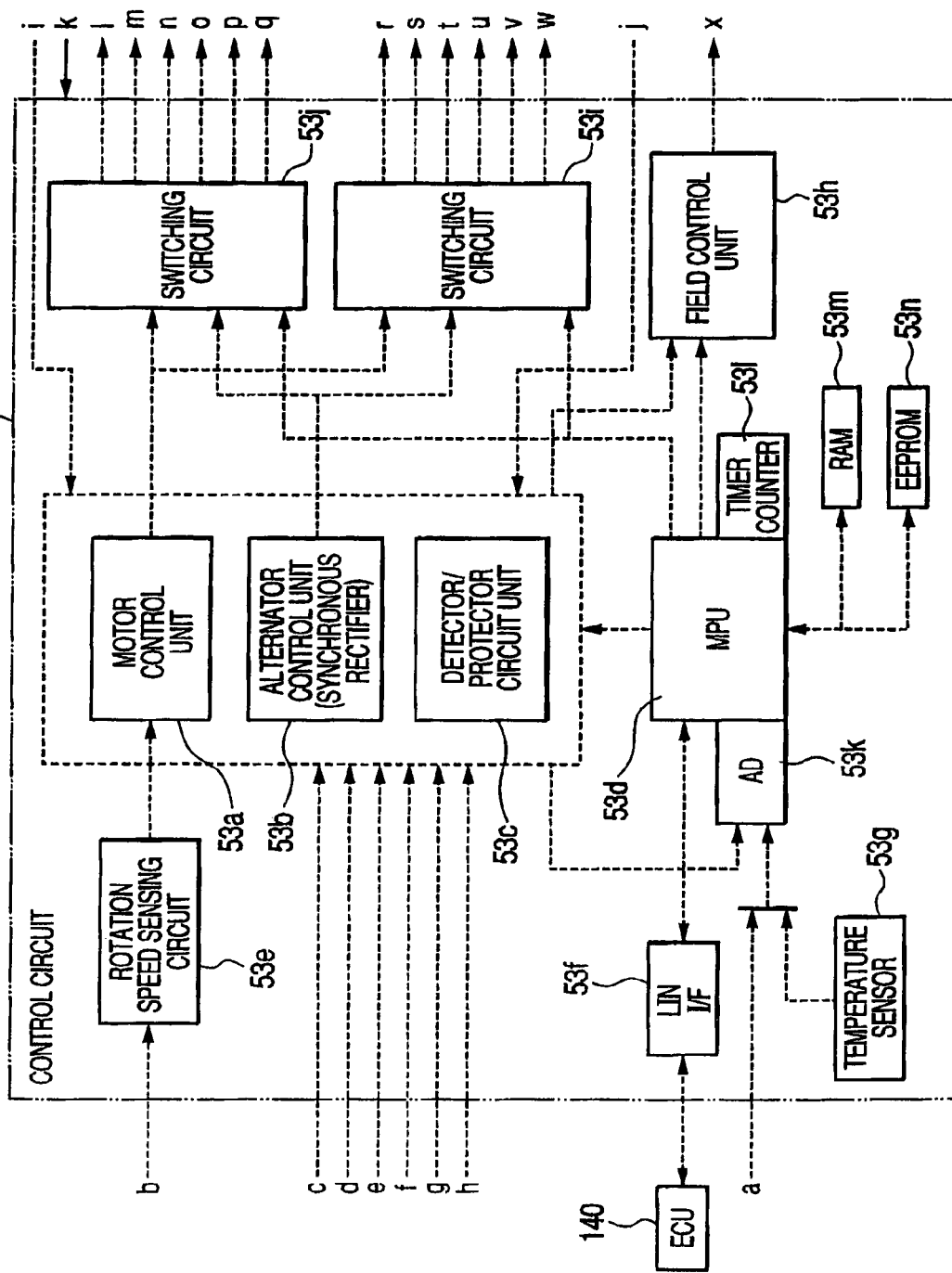
FIG. 5 is a block diagram showing the functional structure of a control circuit shown in FIG. 4.

The field circuit 56 controls a field current that flows into the field winding 8 from the battery 150 due to the switching (on/off) operation of the switching semiconductor device. An N-channel MOSFET 69 is used for the switching element. The drain electrode of the N-channel MOSFET 69 is electrically connected to a negative pole end of the field winding 8 (a side opposite to the positive pole end connected to the higher potential (positive pole) side of the battery 150). A source electrode of the N-channel MOSFET 69 is electrically connected to the lower potential (negative pole) side of the battery 150. A driving signal T from the control unit 51 is inputted to a gate electrode of the N-channel MOSFET 69. A diode 68 is electrically connected between the drain electrodes of the N-channel MOSFET 69 and the higher potential (positive pole) side of the battery 150. The diode 68 is made up of a P-channel MOSFET which is in a forward direction toward the higher potential (positive pole) side of the battery 150 from the drain electrode side of the N-channel MOSFET 69. The control circuit 53 is a circuit that operates by a driving voltage of about 5 V, and includes plural control units as shown in FIG. 5. The driving voltage is applied from the driver circuit 54 which will be described later, and the driving voltage results from stepping down the voltage (about 12 V) of the battery 150. The control circuit 53 inputs a command signal from the engine control device 140 that is a host control device. The command signal from the engine control device 140 is a signal for operating the motor-alternator 100 as a motor, or a signal for operating the motor-alternator 100 as an alternator. Those signals are outputted according to the operation state of the vehicle. For example, in the case of starting the engine 120 to start the vehicle from a stopping state of the vehicle, such a mode of changing from the idle stop to starting of the engine 120, the engine control device 140 outputs a start signal for operating the motor-alternator 100 as the motor to the control circuit 53 when the off of the brake is detected.

The transmission of the command signal from the engine control device 140 to the control circuit 53 is conducted by means of an LIN (local interconnect network) system which is one of the serial communication systems. The command signal from the engine control device 140 to the control circuit 53 through a LIN is inputted to a microprocessor (hereinafter referred to as "MP") 53$d$ through an interface circuit 53$f$. The MP 53$d$ judges the operation mode of the motor-alternator 100 based on an inputted command signal, and outputs the operation commands to the respective control units according to the operation mode so that the respective control units execute given processing corresponding to the operation mode. Also, the MP 53*d* reads program or data corresponding to the operation mode from a RAM 53*m* that is a memory device that can rewrite the stored information or a ROM 53*n* that is a memory device that can read the stored information, or writes the data in the RAM 53*m*. In addition, the MP 53*d* has an A/D converter 53*k* and a timer/counter 53*e*. The AD converter 53*k* converts an analog quantity such as a voltage or temperature inputted to the MP 53*d* into a digital quantity. A timer/counter 531 is used to, for example, measure a time width at which the command value is sequentially changed by the control program and a time interval in which the LIN communication is conducted. As a result, the MP 53*d* can detect the rotation speed of the motor-alternator 100, and can output the predetermined operation commands to the respective control units by comparing the sensed rotation speed with a predetermined rotation speed. The signal transmission between the engine control device 140 and the control circuit 53 is executed by using the LIN, thereby making it possible to reduce the number of communication lines between the engine control device 140 and the control circuit 53.

The control unit has a motor control unit 53*a*, an alternator (synchronous rectifier) control unit 53*b*, and a filed control unit 53*h*.

When the motor-alternator 100 operates as the motor, the motor control unit 53*a* outputs voltage command signals to control the operation of the P-channel MOSFETs 64 and the N-channel MOSFETs 65 of the converter circuit 55. An operation command signal from the MP 53*d*, a rotation speed signal from the rotation speed calculating circuit 53*e*, and phase voltage signals c to h from the converter circuit 55 are inputted to the motor control 53*a* through the driver circuit 54. The rotation speed signal is calculated based on a sensed signal b from a rotation sensor 73. The motor control unit 53*a* outputs voltage command signals for controlling the operation of the P-channel MOSFETs 64 and the N-channel MOSFETs 65 according to the operation command signal from the MP 53*d* and based on the sensed signal b from the rotation sensor 73. The voltage command signals are to control the MOSFETs 64, 65 so that the motor-alternator 100 reaches a target rotation speed. In the voltage command signals from the motor control unit 53*a*, the voltage command signals related to the P-channel MOSFETs 64 at the higher potential side are inputted to a switching circuit 53*j*. The voltage command signals related to the N-channel MOSFETs 65*s* at the lower potential side are inputted to a switching circuit 53*i*.

When the motor-alternator 100 operates as the alternator, the alternator (synchronous rectifier) control unit 53*b* outputs voltage command signals to control the operation of the P-channel MOSFETs 64 and the N-channel MOSFETs 65 of the converter circuit 55. The operation command signal from the MP 53*d*, the phase voltage signals c to h from the converter circuit 55 via the driver circuit 54, a battery higher potential side voltage signal i from the converter circuit 55 via the driver circuit 54, and a battery lower potential side voltage signal j from the driver circuit 54, are inputted to the alternator (synchronous rectifier) control unit 53*b*. The alternator (synchronous rectifier) control unit 53*b* outputs voltage command signals for controlling of the operation of the P-channel MOSFETs 64 and the N-channel MOSFETs 65, in order to synchronously rectify the three-phase AC power from the motor-alternator 100 and convert the AC power into a DC power according to the operation command of the MP 53*d*. In this case, the alternator control unit 53*b* compares a voltage across both ends of the battery 150 with the inputted phase voltage values of the respective phases (in the case where the phase voltage is positive, the phase voltage value is compared with the battery higher potential side voltage, whereas in the case where the phase voltage is negative, the phase voltage value is compared with the battery lower potential side voltage). Then, the alternator (synchronous rectifier) control unit 53*b* outputs voltage command signals for controlling the operation of the P-channel MOSFETs 64 and the N-channel MOSFETs 65 according to the comparison result being equal to or more than a predetermined voltage (forward voltage drop of the diode: about 0.7V), or less. In the voltage command signals from the alternator (synchronous rectifier) control unit 53*b*, the voltage command signals related to the P-channel MOSFETa 64 at the higher potential side are inputted to the switching circuit 53*j*. The voltage command signals related to the N-channel MOSFET 65 at the lower potential side are inputted to the switching circuit 53*i*.

When the motor-alternator 100 operates as the motor or the alternator, the field control unit 53*h* outputs a voltage command signal to control the operation of the N-channel MOSFET 69. The N-channel MOSFET is used to pass a field current through a winding 8 of the field circuit 56. The operation command signal from the MP 53*d* and an abnormality signal from a detector/protector circuit unit 53*c* that will be described later, are inputted to the field control unit 53*h*. When the motor-alternator 100 operates as the motor, the field control unit 53*h* calculates a field current value based on the operation command from the MP 53*d* so that a predetermined torque is outputted from the motor-alternator 100. And the field control unit 53*h* calculates a voltage command value based on the calculated field current value; then, it outputs the voltage command value as a voltage command signal for controlling the operation of the N-channel MOSFET 69. When the motor-alternator 100 operates as the alternator, the field control unit 53*h* calculates a field current value according to the operation command of the MP 53*d* so that a predetermined electrical energy is outputted from the motor-alternator 100. And the control unit 53*h* calculates the voltage command value based on the calculated field current value; then, the field control unit 53*h* outputs the voltage command value as the voltage command signal for controlling the operation of the N-channel MOSFET 69. Also, when a damp surge voltage or the like is detected by the detector/protector circuit unit 53*c*, the field control unit 53*h* outputs the voltage command signal to control the operation of the N-channel MOSFET 69 based on the abnormality signal from the detector/protector circuit unit 53*c* so that the amount of current flowing in the winding 8 is decreased. A voltage command signal x from the field control unit 53*h* is inputted to the driver circuit 54.

The detector/protector circuit unit 53*c* is used to detect the generation of an over-voltage such as a damp surge voltage, an over-current or an over-temperature, and protect a switching element of the converter circuit 55 or the field circuit 56 from such over-voltage, over-current or over-temperature. An operation command signal from the MP 53*d*, phase voltage signals c to h from the converter circuit 55 via the driver circuit 54, a battery higher potential side voltage signal i from the converter circuit 55 via the driver circuit 54, and a battery lower potential side voltage signal j from the driver circuit 54, are inputted to the detector/protector circuit unit 53*c*. The detector/protector circuit unit 53*c* executes various abnormality detections on the basis of the operation command signal from the MP 53*d*. As a result, if there is an abnormality, the detector/protector circuit unit 53*c* outputs the abnormality signal to the MP 53d and the field control unit 53h. For example, in the case where the damp surge voltage is detected by the detector/protector circuit unit 53, the operation command signal is outputted to the switching circuit 53i so that the N-channel MOSFET 65 at the lower potential side of the converter circuit 55 should be turned off.

The switching circuit 53j switches between the voltage command signals from the motor control unit 53a and the voltage command signals from the alternator (synchronous rectifier) control unit 53b according to the operation mode of the motor-alternator 100; and the switched signals are outputted. Those voltage command signals are used for controlling the operation of the P-channel MOSFET 64. The operation command signal from the MP 53d and the voltage command signals from the motor control unit 53a or the alternator (synchronous rectifier) control unit 53b, are inputted to the switching circuit 53j. The switching circuit 53j switches the outputs of the voltage command signals for the P-channel MOSFET 64 according to the operation command signal from the MP 53d, and outputs the switched voltage command signals to the driver circuit 54 as the voltage command signals j to q.

The switching circuit 53i switches between the voltage command signals from the motor control unit 53a and the alternator (synchronous rectifier) control unit 53b according to the operation mode of the motor-alternator 100; and the switched signals are outputted. Those voltage command signals are used for controlling the operation of the N-channel MOSFET 65. The operation command signal from the MP 53d and the voltage command signals from the motor control unit 53a or the alternator (synchronous rectifier) control unit 53b, are inputted to the circuit 53i. The switching circuit 53i switches the outputs of the voltage command signals for the N-channel MOSFET 65 according to the operation command signal from the MP 53d, and outputs the voltage command signals to the driver circuit 54 as the voltage command signals r to w.

In this embodiment, as shown in FIG. 5, the motor control unit 53a, the alternator (synchronous rectifier) control unit 53b, and the detector/protector circuit unit 53c are surrounded by a dotted line. This indicates that the phase voltage signals c to h, the battery high potential side voltage signal i, and the battery low potential side voltage signal J, are commonly inputted to the motor control unit 53a, the alternator (synchronous rectifier) control unit 53b, and the detector/protector circuit unit 53c in the control circuit 53. Arrows indicative of signals that are commonly inputted to the motor control unit 53a, the alternator (synchronous rectifier) control unit 53b and the detector/protector control unit 53c are inputted to the box indicated by the dotted line. Also, the number of arrows of the voltage command signals from the motor control unit 53a and the alternator (synchronous rectifier) control unit 53b, respectively, is equal to the number of P-channel MOSFETs 64 and N-channel MOSFETs 65, that is 12. In this embodiment, for simplification of the drawing, those arrows are indicated by one arrow. In addition, in this embodiment, in order to distinguish between power flows and signal flows, the power flows are indicated by solid lines, and the signal flows are indicated by dotted lines, respectively.

The control circuit 53 is provided with a temperature sensor 53g. Also, a thermistor 57 is disposed in the converter circuit 55, a sensing signal from the termistor 57 is inputted to the control circuit 53. In the control circuit 53, any signal of the sensing signal from the temperature sensor 53g and the sensing signal from the thermistor 57 is selected and inputted to an A/D converter 53k. Then, the signal is converted into a digital signal and inputted to the MP 53d.

Figure 6:
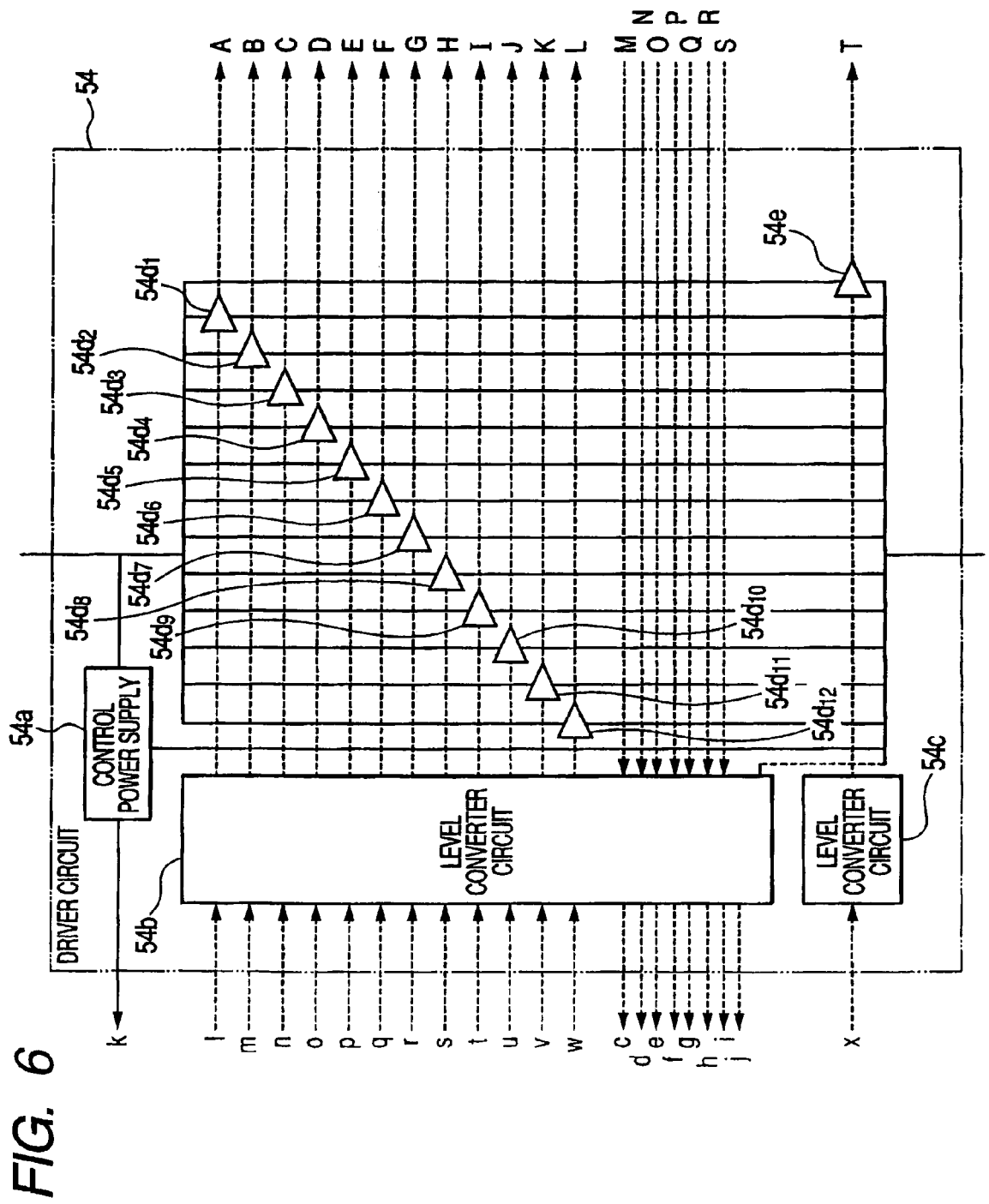
FIG. 6 is a block diagram showing the functional structure of a driver circuit shown in FIG. 4.

The driver circuit 54 operates at an output voltage (about 12 V) of the battery 150, and as shown in FIG. 6, comprises driver units $54d_1$ to $54d_{12}$, $54e$, level converter circuits $54b$, $54c$, and a control power supply $54a$. The control power supply $54a$ is electrically connected between both poles of the battery 150, and outputs a driving power of the control circuit 53. The control power supply $54a$ supplies a control power k resulting from stepping down the output voltage (about 12 V) of the battery 150 to about 5 V to the control circuit 53. The driver units $54d_1$ to $54d_6$ output driving signals to drive the P-channel MOSFET 64 corresponding to the converter circuit 55. The driver unit $54d_7$ to $54d_{12}$ output driving signals to turn on/off the N-channel MOSFET 65 corresponding to the converter circuit 55. The driver unit $54e$ outputs a driving signal to drive the N-channel MOSFET 65 of the field circuit 56. The voltage command signals l to q among the voltage command signals outputted from the control circuit 53, are increased in the potential level by the level converter circuit $54d$ and then inputted to the corresponding driver units $54d_1$ to $54d_6$, Likewise, the voltage command signals r to w are increased in the potential level by the level converter circuit $54d$ and then inputted to the corresponding driver units $54d_7$ to $54d_{12}$. The voltage command signal x from the control circuit 53 is increased in the potential level by the level converter circuit $54c$ and then inputted to the driver unit $54e$. The driver units $54d_1$ to $54d_6$ output the driving signals A to F to the gate electrode of the corresponding P-channel MOSFET 64 according to the inputted voltage command signals 1 to q. The driver units $54d_7$ to $54d_{12}$ output the driving signals G to L to the gate electrode of the corresponding N-channel MOSFET 65 according to the inputted voltage command signals r to w. The driver unit $54e$ outputs the driving signal T to the gate electrode of the corresponding N-channel MOSFET 65 according to the inputted voltage command signal x. The level converter circuit $54d$ drops the potential levels of the phase voltage signals M to R and the battery higher potential side voltage signal S from the converter circuit 55, and then output those signals to the control circuit 53 as the phase voltage signals c to h and the battery higher potential side voltage signal i. In addition, the level converter circuit $54b$ takes in the lower potential side voltage of the battery 150 as the battery lower potential side voltage signal, drops the potential level and outputs the voltage to the control circuit 53 as the battery lower potential side voltage signal j.

Figure 9:
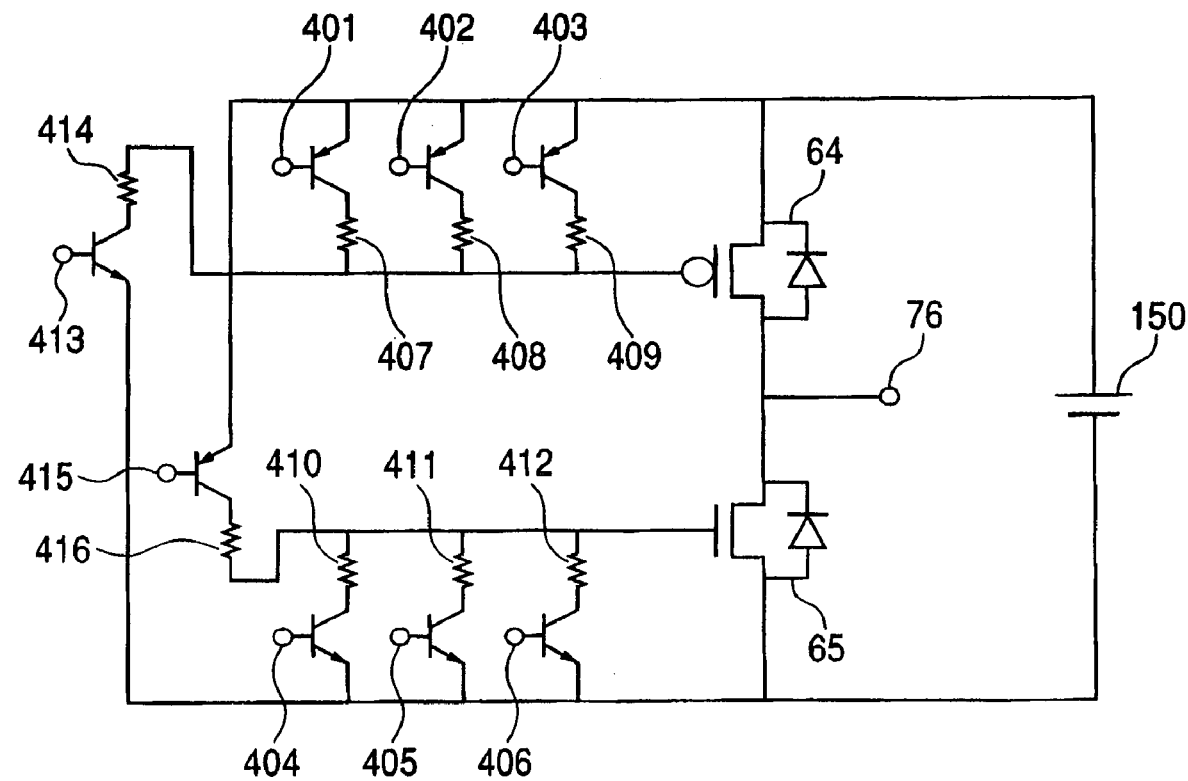
FIG. 9 is a circuit structural diagram showing the circuit structure of a driver unit of the driver circuit shown in FIG. 6.

Each of the driver units $54d_1$ to $54d_{12}$ is made up of a circuit including a transistor and a resistor, as shown in FIG. 9. In this example, there is shown a structure of a driver unit for one arm which consists of a P-channel MOSFET 64 and an N-channel MOSFET 65. The driver unit for driving the P-channel MOSFET 64 is made up of the following an off-circuit and an on-circuit. The off-circuit comprises a series circuit of a transistor 401 and a resistor 407, a series circuit of a transistor 402 and a resistor 408, and a series circuit of a transistor 403 and a resistor 409; and the off-out circuit is formed by connecting these series circuits in parallel. The on-circuit is formed with a series circuit of a transistor 413 and a resistor 414. The driver unit for driving the N-channel MOSFET 65 is made up of the following an off-circuit and an on-circuit. The off-circuit comprises a series circuit of a transistor 404 and a resistor 410, a series circuit of a transistor 405 and a resistor 411; and a transistor 406 and a resistor 412; and the off-circuit is formed by connecting these series circuits in parallel. The on-circuit is formed with the series circuit of a transistor 415 and a resistor 416. In the off-circuit of the P-channel MOSFET 64, each emitter electrode of the transistors 401–403 is electrically connected to a source electrode side of the P-channel MOSFET 64, and each end of the resistors 407–409 opposite to each collector electrode of the transistors 401–403 is electrically connected to a gate electrode side of the P-channel MOSFET 64. In the on-circuit of the P-channel MOSFET 64, an emitter electrode of the transistor 413 is connected to a source electrode side of the N-channel MOSFET 65, and end of the resistor 414 opposite to a collector electrode of the transistor 413 is connected to a gate electrode side of the P-channel MOSFET 64. In the off circuit of the N-channel MOSFET 65, each emitter electrode of the transistors 404–406 is electrically connected to a source electrode side of the N-channel MOSFET 65, and each end of the resistors 410–412 opposite to each collector electrode side of the transistor 404–406 is electrically connected to a gate electrode side of the N-channel MOSFET 65. In the on circuit of the N-channel MOSFET 65, an emitter electrode side of the transistor 415 is electrically connected to a source electrode side of the P-channel MOSFET 64, and an end of the resistor 416 opposite to a collector electrode side of the transistor 415 is electrically connected to a gate electrode side of the N-channel MOSFET 65.

In the driver unit thus structured according to this embodiment, by changing the off signal applied to the base electrodes of the transistors 401 to 403 (off circuit of each P-channel MOSFET 64 switch), it possible to control a speed of drawing out the electric charges of the gate electrode of the P-channel MOSFET 64 according to the resistances of the resistors 407 to 409. For example, when it is assumed that the resistances of the resistors 407 to 409 are 100, 200 and 400, the resistances in the off circuit of the P-channel MOSFET 64 can be adjusted in a wide range of about 6 to 400. According to this embodiment, when the MOS elements for the converter circuit 55 are changed, the switching speed of that element can be readily changed. Also, according to this embodiment, since the control circuit 53 has the MP 53d, the RAM 53m and the ROM 53n, the off signal supplied to the base electrode of the transistors 401 to 403(off circuit of the P-channel MOSFET 64) can be readily changed over by changing of the variable of the memory. In addition, according to this embodiment, by changing the program of the switching timing of the off signal that is applied to the base electrode of the transistors 401 to 403, it possible to perform soft switching for changing a speed depend on time at which the gate electric charges of the transistors 401 to 403 is drawn out. The same is applied to the N-channel MOSFET 65 side.

Subsequently, the actual structure of the motor-alternator 100 according to this embodiment will be described with reference to FIGS. 1 to 3. First, the structure of the rotary electric machine body 1 will be described.

In FIG. 3, reference numeral 2 denotes a stator. The stator 2 has a stator core 6 and a stator winding 5 installed on the stator core 6. The stator core 6 is formed of a cylindrical lamination core resulting from forming a plurality of annular core plates each of which is obtained by punching a thin silicon steel plate. The thickness of each of the core plates laminated at both ends of the lamination core in the axial direction is thicker than the core plates laminated in the middle portion in the axial direction. A core back (not shown) is formed on the outer peripheral portion of the stator core 6 is formed with. The core back is formed of a cylindrical core portion that is formed continuously in the circumferential direction, and is held between a front bracket 12 and a rear bracket 13 from both sides thereof in the axial direction. With the above structure, the stator 2 is supported at the inner side of the brackets. Plural teeth (not shown) are formed on the inner circumferential side of the core back which is an inner circumferential portion of the stator core 6. The teeth are dentate core portions that are so formed as to project toward an inner center side in the radial direction from the inner circumferential surface of the core back, and formed continuously in the axial direction along the inner circumferential surface of the core back. The plural teeth are at given intervals in the circumferential direction along the inner circumferential surface of the core back. Slots (not shown) of the same number as that of the teeth are formed between the respective adjacent teeth. The slots are space portions for receiving the winding conductors that constitute the stator winding 5, and formed continuously in the axial direction as with the teeth portion. Plural slots are arranged at predetermined intervals in the circumferential direction. Also, a side opposite to the core back of each slot is opened, and both ends of the slot in the axial direction are also opened. Each of the slots receives the winding conductor that constitutes the stator winding 5. Each of the winding conductors is formed by a rectangular wire or a circular wire. Each of the winding conductors projects outward from both ends of the stator core 6 in the axial direction to be connected to obtain a star connection. In this embodiment, the stator winding 5 is formed of two three-phase windings that are electrically independent from each other.

The rotor 3 is so disposed as to face the inner circumferential side of the stator 2 with a gap. A rotary shaft 9 is disposed on the center axis of the rotor 3. One end side of the rotary shaft 9 is supported rotatably by a bearing 14 at the center portion of the front bracket 12, and the other end side is supported by a bearing 15 at the center portion of the rear bracket 13. A portion of the rotary shaft 9 which faces the inner circumferential side of the stator 2 is fixed into a rotor core 7. The rotor core 7 is structured so that a pair of unguiform magnetic pole cores face each other in the axial direction. The unguiform magnetic pole cores have plural unguiform magnetic poles that extend toward the centrifugal side in the radial direction from the cylindrical core portion, and have triangular or trapezoidal leading ends folded at right angles in directions along which those leading ends face each other. The unguiform magnetic poles are arranged at given intervals in the rotational direction. In the case where the unguiform magnetic poles face each other in the axial direction, the unguiform magnetic poles are arranged between the respective unguiform magnetic poles of the unguiform magnetic pole cores that face each other, One of the unguiform magnetic pole cores forms an N pole. The other magnetic pole forms an S pole. With the above structure, the rotor 3 has plural magnetic poles formed in such a manner that the polarity is alternately different in the rotational direction, that is, the N pole and the S pole are alternate. The field winding 8 is disposed on the outer circumference of the core portions which face the inner circumferential side of the leading portions of the unguiform magnetic poles. One end of the rotary shaft 9 in the axial direction (end portion of the front bracket 12 side) extends toward the outer side in the axial direction farther than the bearing 14. A pulley 100a is disposed on a portion that extends toward the outer side in the axial direction farther than the bearing 14 on one end of the rotary shaft 9. The pulley 100a is connected to a pulley 120a of the engine 120 through a belt (not shown). The other end of the rotary shaft 9 in the axial direction (the end portion on the rear bracket 13 side) extends toward the outer side in the axial direction farther than the bearing 15. A slip ring 17 is disposed on the outer circumferential surface of the portion that extends toward the outer side in the axial direction-farther than the bearing 15 on the other end of the rotary shaft 9. The slip ring 17 is electrically connected to the field winding 8. The slip ring 17 is slidable in contact with a brush 16. The brush 16 supplies a field current to be supplied to the field winding 8 to the slip ring 17. A front fan 11 is attached onto one end of the unguiform magnetic pole core (end portion on the front bracket 12 side) in the axial direction. A rear fan 10 is attached onto the other end of the unguiform magnetic pole core (end portion on the rear bracket 13 side) in the axial direction. The front fan 11 and the rear fan 10 rotate together with the rotation of the rotor 3 so that an outside air to be a cooling medium is introduced into the interior of the machine from the exterior and then circulated within the machine, and the outside air that has finished the cooling function is exhausted toward the exterior from the interior of the machine. In order to achieve the above operation, plural through-holes are provided at the front bracket 12 and the rear bracket 13 in order to introduce the outside air into the interior of the machine from the exterior and to exhaust the outside air toward the exterior from the interior of the machine.

A space defined by module cases 62 and 63 is formed on one side of a side surface of the rear bracket 13 (a side opposite to the front bracket 12 side). An inverter device 50 is installed in the space. The module case 63 serves as a brush holder that holds the brush 16. A communication terminal 60 and a battery terminal 18 are exposed from the module case 62 toward the external. The rear bracket 13 is electrically connected to a chassis of the automobile 200. A positive pole side of the inverter device 50 is electrically connected to the battery terminal 18, and a negative pole (ground) side is electrically connected to the rear bracket 13. The above structure has the compatibility with the general vehicle alternator.

Now, a specific arrangement structure of the inverter device 50 will be described. Concerning the structure of the control circuit 53 including the converter circuit 55 and the control power supply 54*a*, there are considerable two types. One of the converter circuits 55 may be formed of P-channel MOSFETs 64 and N-channel MOSFETs 65. Another may be formed of only the N-channel MOSFETs 65. Herein both types thereof will be described in comparison. In the inverter for outputting a large current, the N-channel semi conductor device is mainly used in order to reduce the loss of the semiconductor device at the on time. However, in this embodiment, the control circuit 53 including the converter circuit 55 and the control power supply 54 is structured as shown in FIG. 1 for the purposes of the downsizing and the high-temperature durability in order to mount the inverter device 50 integrally with the rotary electric machine body 1. The structure of the control circuit 53 including the converter circuit 55 and the control power supply 54*a* as in the latter is shown in FIG. 12.

Figure 1:
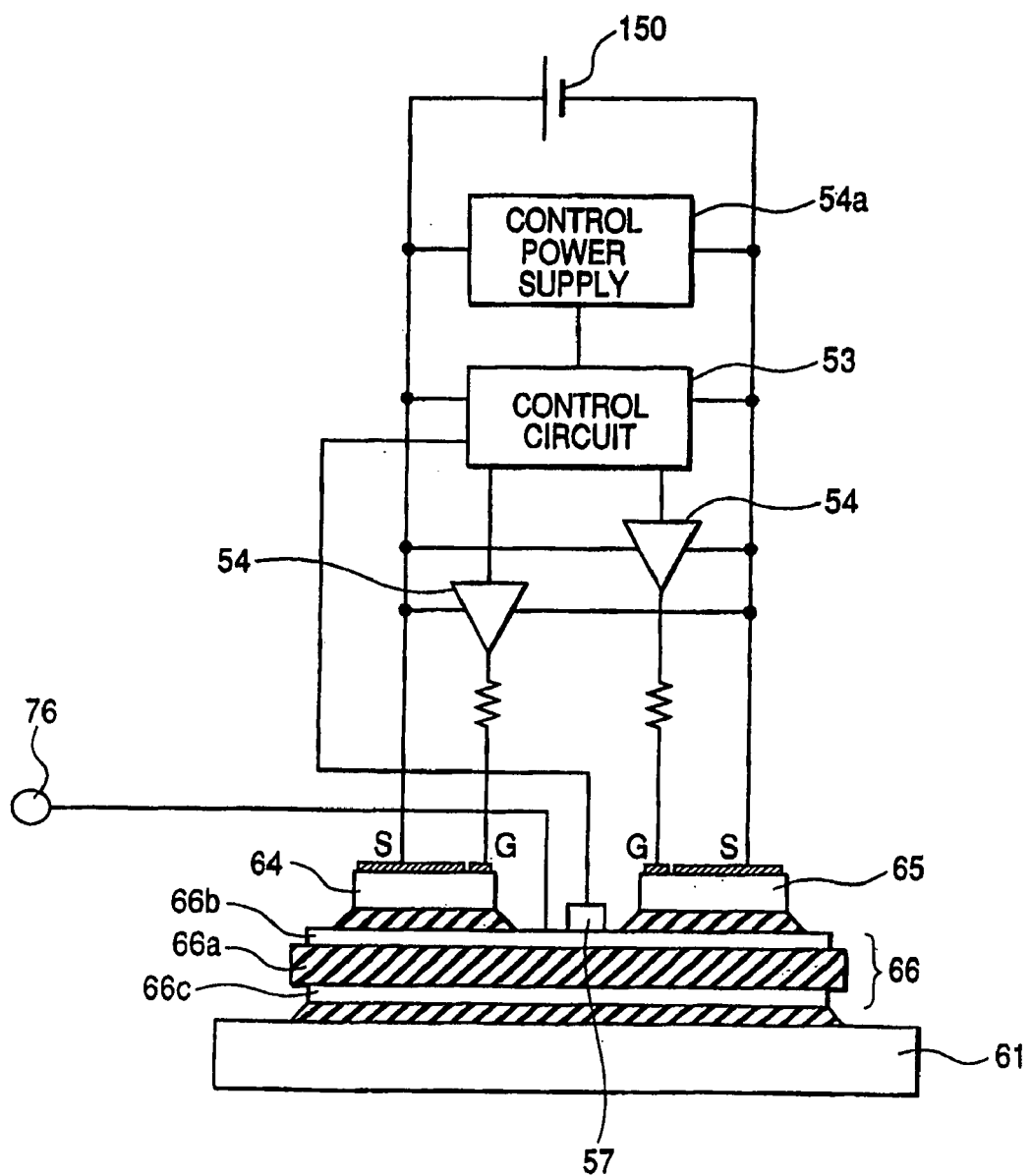
FIG. 1 is a plan view showing a semiconductor device mounting structure of a converter circuit in an inverter device that is integrally mounted on a motor-alternator which is an embodiment of the present invention.
Figure 12:
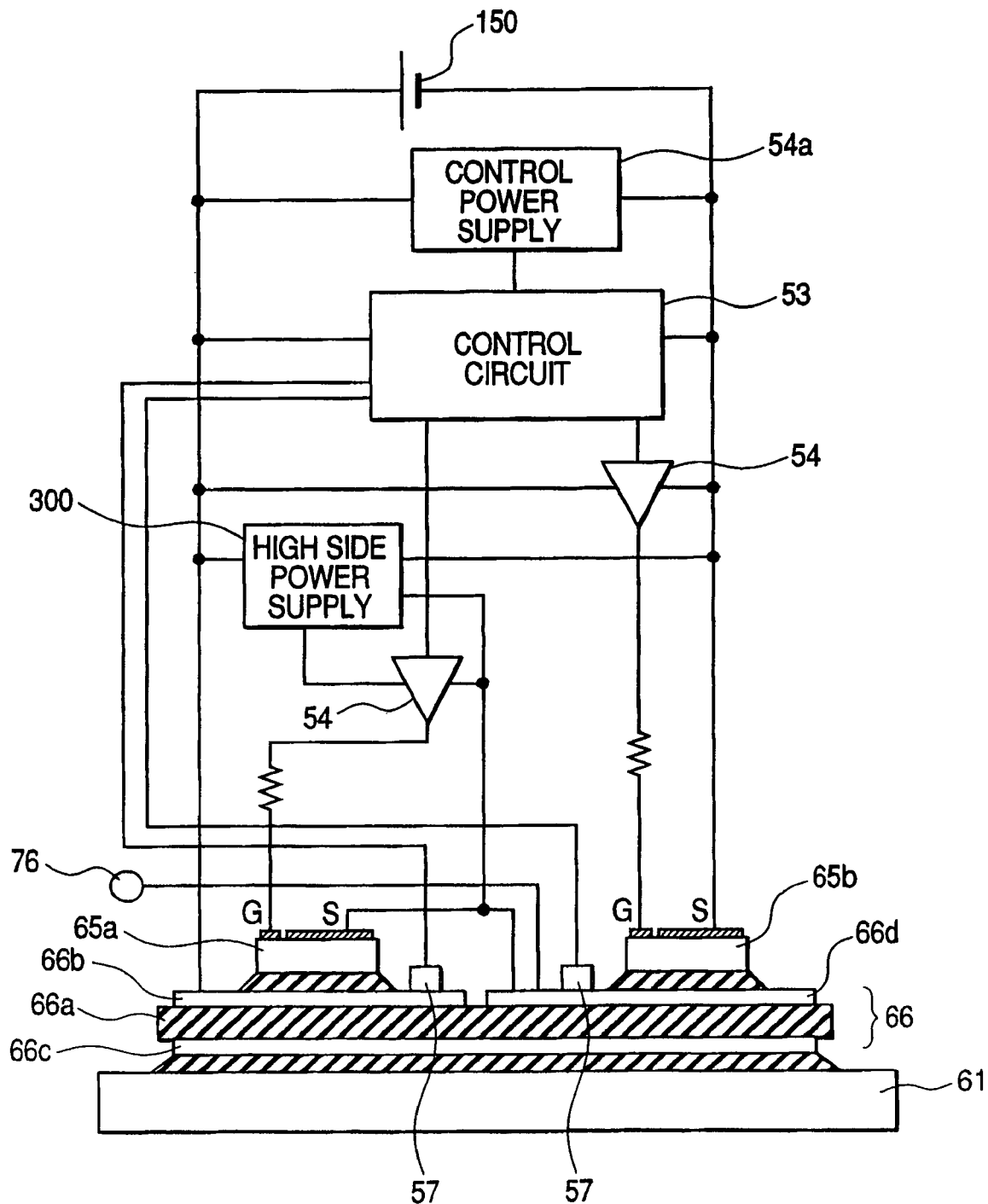
FIG. 12 is a plan view showing the semiconductor device mounting structure of a converter circuit in an inverter device according to a comparative example.

When the circuits in FIGS. 1 and 12 are compared with each other, in the circuit shown in FIG. 12, in order to drive an N-channel MOSFET 65*a* on the higher potential side, there is required a high side power supply 300 relative to a potential of an output terminal 76 which fluctuates due to the rotation of the motor-alternator 100. However, in the circuit of this embodiment shown in FIG. 1, in MOSFETs of the higher potential side, a potential between the higher potential and the lower potential can be supplied to the gate electrodes of each MOSFET relative to the higher potential side of the battery 150; and In MOSFETs of the lower potential side, the potential between the higher potential and each lower potential can be supplied to the gate electrodes of each MOSFET relative to the lower potential side (ground potential) of the battery 150; thereby making it possible to drive the respective MOSFETs. This means that, in order to drive the three-phase alternating motor, the high side power supply 300 for driving the MOSFET on the higher potential side is not required in the circuit shown in FIG. 1, whereas at least three high side power supplies 300 are required in the circuit shown in FIG. 12. Moreover, an electrolyte capacitor that is relatively large in the electrostatic capacity is required in the high side power supply 300 in order to hold the voltage. The electrolyte capacitor suffers from a problem on the reliability under the high-temperature environment. A relationship between the lifetime of the electrolyte capacitor and the temperature is frequently expressed by the following relational expression that applies the Arrhenius law.

$$L = L_c * A^{((T_c - T)/10)}$$

where L is the lifetime at the used temperature T, Lc is the lifetime at a reference temperature $T_c$, T is the used temperature, $T_c$ is the reference temperature, and A is a temperature acceleration coefficient. The lifetime of the electrolyte capacitor means an increase in the internal resistance and a decrease in the capacitance. For example, in the case of A=2, the lifetime becomes ½ when the used temperature T is higher than the reference temperature $T_c$ by 10°. As described above, the electrolyte capacitor exponentially deteriorates the performance under the high-temperature environments. Also, it is impossible to make the electrolyte capacitor IC-compatible, and the electrolyte capacitor is improper for downsizing the circuit. From this viewpoint, there is required a structure in which the electrolyte capacitor is not used in the rotating electric machine that mounts the inverter device 50 integrally with the rotating electric machine body 1. On the other hand, because the control power supply 54*a* for only the necessary control circuit 53 in the circuit of this embodiment shown in FIG. 1 steps down the output voltage of the battery 150 to generate the reference voltage, there can be provided the power supply circuit that does not require the electrolyte capacitor. From this viewpoint, in order to constitute the inverter device that proves the heat resistance using no electrolyte capacitor, it is understood that the circuit of this embodiment shown in FIG. 1 is effective. Also, there are a large number of MOSFETs that are driven by a power supply of about 10 V to 14 V. From this viewpoint, since the circuit structure of this embodiment shown in FIG. 1 can use the 14 V power supply mounted on a large number of vehicles as it is, the MOSFET is proper for the inverter built-in rotating electric machine that is applied to the 14 V power supply vehicle.

Subsequently, the structures shown in FIGS. 1 and 12 are compared with each other from the viewpoint of an area in which the converter circuit is mounted. In FIGS. 1 and 12, an insulating substrate 66 is formed of a circuit board where electrically conductive plates 66*b* to 66*d* and an insulating plate 66*a* are put together. The insulating plate 66*a* is made of aluminum nitride, silicon nitride or alumina which is an insulating material that is excellent in the heat conductance. In the circuit structure shown in FIG. 12, there is required that the conductive plates 66*b* and 66*d* of the insulating substrate 66, which also serve as wirings of the converter circuit, are divided into two pieces and insulated from each other in order to fix the MOSFETs at the higher potential side and the lower potential side. As a result, it is necessary to provide a predetermined distance between the conductive plates 66*b* and 66*d* for insulation. Also, there is required an area for a wiring that connects a source electrode of the MOSFET 65a at the higher potential side to the conductive plate 66d of fixing the MOSFET 65b at the lower potential side. On the contrary, in the circuit structure of this embodiment shown in FIG. 1, because the MOSFET 64 at the higher potential side and the MOSFET 65 at the lower potential side can be fixed onto the single conductive plate 66b, the mounting area can be reduced more than the circuit structure shown in FIG. 12 without the above-mentioned restriction. Also, in the motor-alternator 100 of this embodiment, the importance of the temperature management of the MOS semiconductor that is a main heating part is high because the motor-alternator 100 is used under the high-temperature environments. In order to manage the temperature with higher precision, it is essential to locate a temperature sensing thermistor 57 on the conductive plate 66b on which the MOS semiconductor is fixed. In the circuit shown in FIG. 12, two thermistors 57 are required because the conductive plates on which the MOS semiconductors at the higher potential side and the lower potential side are fixed are separated from each other. On the other hand, one thermistor 57 maybe provided in the circuit structure according to this embodiment shown in FIG. 1. Even if an area necessary to locate the thermistor 57 is not taken into consideration, the circuit structure of this embodiment shown in FIG. 1 can reduce the mounting area more than the circuit structure shown in FIG. 12.

Accordingly, this embodiment, in which the circuit structure shown in FIG. 1 is applied, solves problems occurring when the inverter device 50 is integrally mounted on the rotating electric machine body 1, that is, problems such as the downsizing and the high-temperature durability.

Hereinafter, a specific arrangement structure of the inverter device 50 will be described with reference to FIG. 2. In FIG. 2, reference numeral 64 denotes each P-channel MOSFET, 65 is each N-channel MOSFET, 66 is an insulating substrate, 61 is a radiation conductive plate, 67 is an output terminal, 70P and 70N are power supply wirings, 71 is a positive pole side power terminal, 72 is a control circuit board, and 51 is a control IC (control unit). Also, reference numeral 60 denotes a communication terminal, 74 is a wiring for connects the source electrode of the P-channel MOSFET 64 and the power supply wiring 70P, 75 is a wiring that connects the source electrode of the N-channel MOSFET 65 and the radiation conductive plate 61, 76 is a wiring that connects an electrically conductive plate of the insulating substrate 66 and the output terminal 67, 73 is a rotation sensor, and 77 is a wiring that connects a P-channel MOSFET as a diode 68 and the power supply wiring 70P. Further, reference numeral 78 denotes a wiring that connects the insulating substrate and the power supply wiring 70N, 69 denotes a wiring that connects the source electrode of the N-channel MOSFET 69 and the radiation conductive plate 61, 80 is an aluminum wire for connecting the control circuit board 72 to the P-channel MOSFET 64 and the N-channel MOSFETs 65, 69, respectively.

Figure 2:
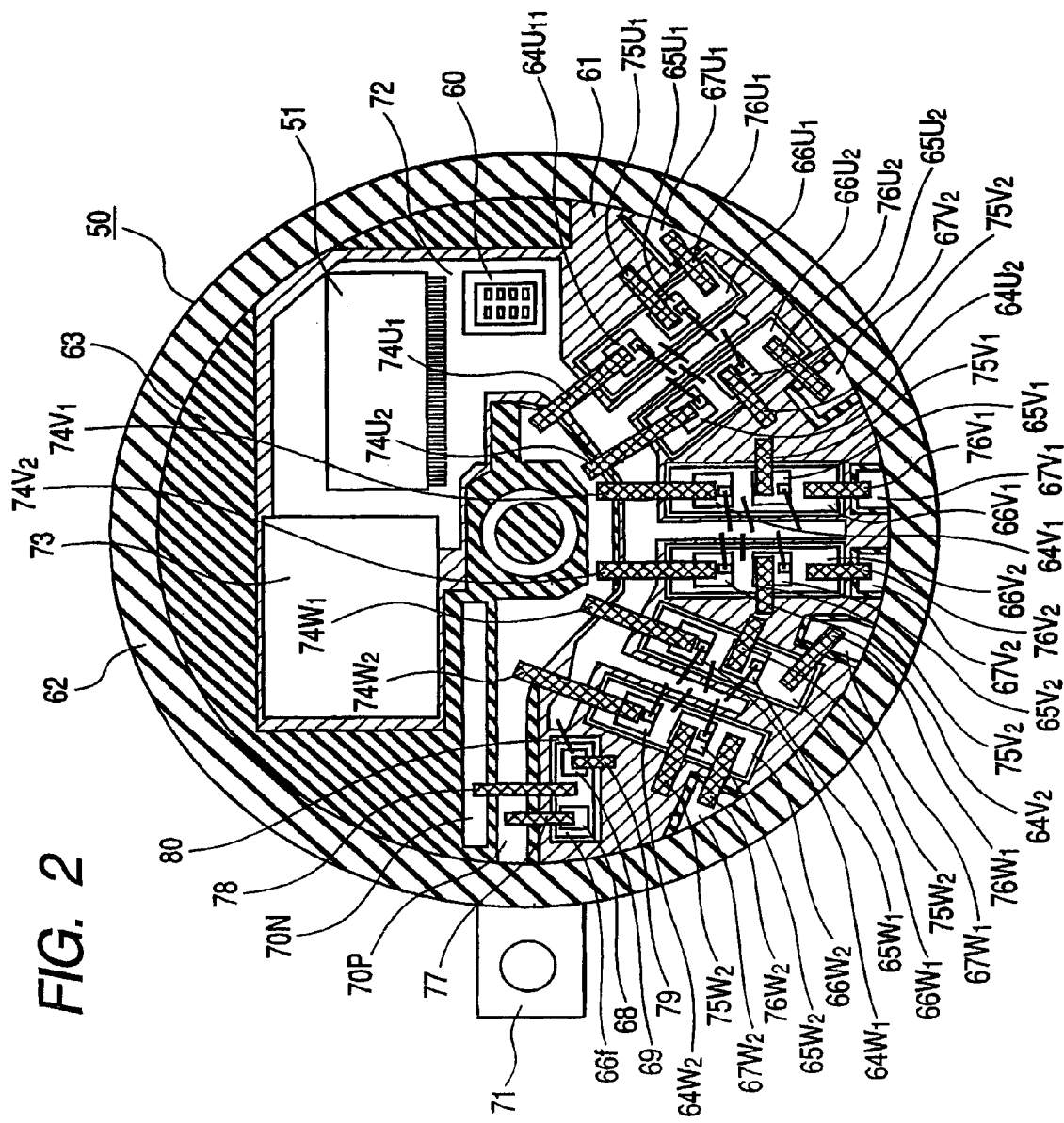
FIG. 2 is a plan view showing a mounting structure of the Inverter device that is integrally mounted on the motor-alternator which is the embodiment of the present invention.

As shown in FIG. 2, the control unit 51 and the rotation sensor 73 are disposed in an upper half of a space within the module cases 62 and 63, and the module unit 52 is disposed in a lower half of the space. The drain electrodes of the P-channel MOSFET 64 and the N-channel MOSFET 65 are connected to the conductive plates of the Insulating substrate 66 in which the conductive plates are bonded to the insulating plate. The source electrode of the P-channel MOSFET 64 and the power supply wiring 70P are connected by the wiring 74. The source electrode of the N-channel MOSFET 65 and the radiation conductive plate 61 that also serves as the ground wiring are connected by the wiring 75. The conductive plates of the insulating plate 66 and the output terminal 67 are connected by the wiring 76. With the above structure, the mounting structural bodies shown in FIG. 1 (arms of the respective phases which constitute the bridge circuit) are disposed radially so as to extend in the radial direction in the lower half of the space within the module cases 62 and 63. Reference U1, U2, V1, V2, W1 and W2 attached to reference numeral correspond to the respective phases of the two stator wirings 5. In this embodiment, the mounting structural bodies shown in FIG. 1 are arranged in such a manner that the mounting structural bodies of the same phase are adjacent to each other. The output terminal 67 is connected to a phase winding corresponding to the stator wiring 5. In this embodiment, a description is given of the structure in which six insulating substrates 66 are mounted, and the stator windings 5 of two systems are provided. In the case where the stator winding 5 of one system is provided, the arms of the respective phases which constitute the bridge circuit may be disposed in such a manner that the arms of the same phase are arranged in parallel and connected to the phase windings corresponding to the stator windings 5.

The output terminal 67, the power supply terminal 71 and the power supply wirings 70P, 70N are embedded in the module case 63 so as to be exposed on the surface of the module case 63. A part of the module case 63 adheres to the radiation conductive plate 61.

Plural electronic circuit elements that constitute the control circuit 53 and the driver circuit 54 in the control unit 51 are integrated into one IC chip. The control IC 51 is disposed on the control circuit board 72 and electrically connected to the control circuit board 72. The P-channel MOSFET 64 and the N-channel MOSFETs 65, 69 in the module unit 52, and the control circuit board 72 are electrically connected to each other by the aluminum wire 80. The control circuit board 72 is also electrically connected with the communication terminal 60 and the rotation sensor 73. The communication terminal 60 is used for communication with the engine control device 140 and connected with an LIN. The rotation sensor 73 detects the rotational speed of the motor-alternator 100 by sensing the magnetism of a magnetic pole disk 4 that is disposed at an end of the rotary shaft 9.

The P-channel MOSFET 68 makes its gate electrode identical in potential with its source electrode so as to be used as a diode. As a result, the drain electrode of the P-channel MOSFET 68 and the drain electrode of the N-channel MOSFET 69 are joined to the conductive plate of the insulating substrate 66f as the MOSFET of the converter circuit 55.

The control IC 51 has the function of the regulator IC of the conventional vehicle alternator. As a result, the control IC 51 serves as the regulator IC. As described above, it is necessary to improve the high-temperature durability in the rotating electric machine on which the inverter device is integrally mounted. In addition, it is necessary to reduce the heating of the semiconductor elements that constitute the converter circuit 55 to suppress a rising temperature of the inverter device. In particular, in the case where the inverter device is used for idling stop, a time required for motor driving when the engine 120 is restarted is less than one second, and most of the running time of the motor-alternator 100 functions as the alternator. From the above fact, the loss reduction at the time of electric power generation is effective in suppression of the rising temperature of the inverter device.

In the case where the synchronous rectifying function is not used, rectification is conducted by a diode that is installed in the MOS semiconductor device of the converter circuit 55. For example, in the case where a current 50A passes through into the diode, a built-in potential of about 1V is required with the result that heating of 50 A×about 1 V=about 50 W occurs. On the contrary, because the on-resistance of the MOSFET can be set to about 3 mO, the heating in the case where a current of 50A passes through the MOSFET becomes about 3 mO×(square of 50A)=about 7.5 W. The heating value of the diode is about 7 times as large as the heating value of the MOSFET. As is understood from this fact, to conduct synchronous rectification at the time of electric power generation is every effective in the suppression of the rising temperature of the inverter device. As another countermeasure against the case where heating is large, there is a method of increasing the mounting area of the semiconductor device in the converter circuit 55. However, taking the heating value of the diode into consideration, the area of about seven times is required in order to offset the heating of about seven times, and this method is improper from the viewpoints of downsizing and the cost reduction. For the above reasons, in this embodiment, the synchronous rectifying function is provided to the control IC 51.

In order to mount the control circuit 53 on the rotating electric machine body 1, it is essential to integrate the electronic circuit elements that constitute the control circuit 53 as with the control IC 51. However, a long developing period of time and high developing costs are taken for development of the IC. For that reason, a device that suppresses the developing costs and flexibly deals with various vehicles is required. Also, it is desirable that the control IC 51 can also flexibly deal with a change in the semiconductor device used in the converter circuit 55 and a change in the specification of the stator winding 5 of the motor-alternator 100. In this embodiment, in order to enhance the flexibility, an MP 53d, a RAM 53m and a ROM 53n are mounted on the control IC 51. By rewriting the memory contents in the ROM 53n, it is possible to change parameters for controlling the power generation or parameters for controlling the drive current at the time of starting the motor according to the battery voltage, the temperature or the engine rotational speed.

Figure 11:
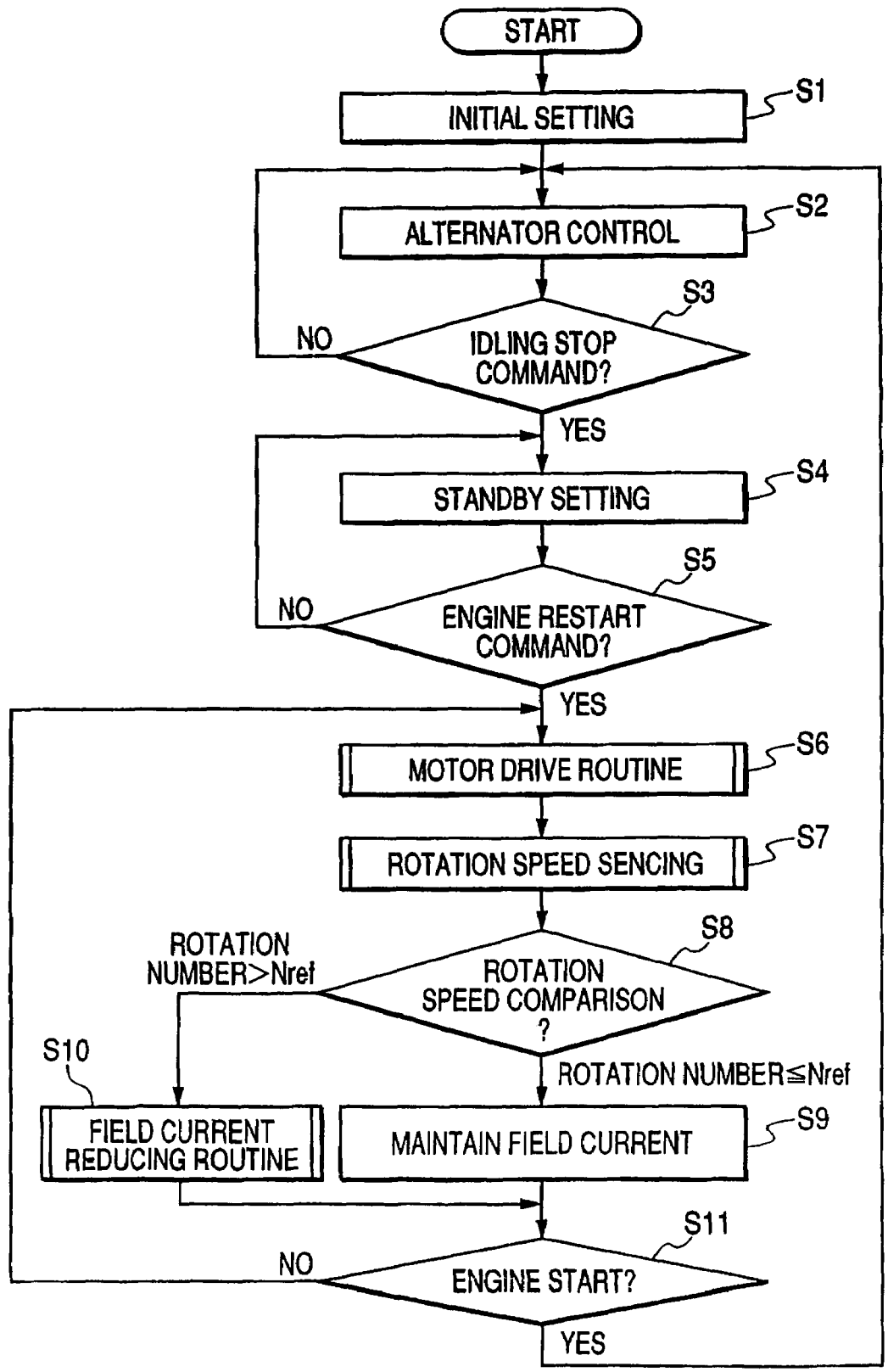
FIG. 11 is a flowchart showing the operation of the motor-alternator according to the embodiment of the present invention.

Subsequently, the operation of the motor-alternator 100 according to this embodiment will be described with reference to FIG. 11. Initial setting is executed in Step S1, and an electric power generation control routine is executed in Step S2. In the electric power generation control, the field control executed through the use of the synchronous rectification control, the battery voltage, the command battery voltage and the temperature detected by the temperature sensor circuit. In Step S3, it is judged whether idling stop, that is, the engine 120 stops, or not, and if Judgment is not the idling stop, processing is advanced to Step S2, and the electric power generation continues. If the judgment is the idling stop, a standby state setting for restarting the engine 120 is executed in Step S4. As one operation of the standby state setting, there is an operation where a predetermined field current Is allowed to pass through the field winding 8 in advance so that a torque occurs immediately at the time of restart. The predetermined field current varies according to the electric constant of the field winding 8 or the amount of torque necessary to restart the engine 120. In the control IC 51 that mounts the MP 53d, the RAM 53m and the ROM 53n, the standby state setting can be dealt with by changing a variable of the memory.

In Step S5, it is judged whether there is a restart command of the engine 120, or not. When there is no restart command of the engine 120, the standby state continues, and when there is the restart command, the processing is advanced to Step S6. In Step S6, the motor drive routine is executed. The rotational speed of the motor-alternator 100 is detected in Step S7, and the detected rotational speed Is compared with a targeted rotational speed Nref. In the case where the detected rotational speed is equal to or less than the targeted rotational speed Nref, a set value of the field current is maintained in Step S9. In the case where the detected rotational speed exceeds the targeted rotational speed Nref, a field magnetic current reduction routine is executed in Step S10, and the field magnetic current is reduced down to a predetermined value. Then, it is judged whether the engine 120 is restarted, or not, in Step S11. The restart judgment in Step S11 is made by, for example, a command signal from the engine control device 140. After the engine 120 starts, the processing is advanced to the electric power generation control in Step S2, and when the engine 120 does not start, the processing is returned to Step S6, and the motor drive routine continues. If the engine 120 starts at a high rotational speed while the field current is kept large, and a large electric power is rapidly generated, a rapid load fluctuation of the engine 120 occurs. Step S10 is a routine that is executed to reduce the field current and to prevent from such a rapid load fluctuation of the engine.

Also, this embodiment desirably applies not a system of bringing the switching semiconductor device into operation at a carrier frequency of several kHz as the PWM control system, but a system of driving the motor with one on/off operation per one cycle as the motor drive system.

In the inverter, a serge voltage dependent on a wiring inductance of causing a change in turn off speed of a current and a current value is applied to the switching semiconductor device. As means for reducing the serge voltage, there is a method of reducing the wiring inductance by disposing the electrolyte capacitor with the capacity of about 0.5 mF to 10 mF between the battery and the ground. However, in this embodiment, it is difficult to use the electrolyte capacitor with a large capacity from the viewpoints of the operation environments and downsizing.

To reduce the serge voltage, there may be proposed that a turnoff speed of the current is made gentle. In this point, in the case of using the PWM control system, if the turn off speed of the current is made gentle, the loss in the switching semiconductor element which occurs every time switching is conducted cannot be ignored. However, in the system of driving the motor with one on/off operation per one cycle is applied, the amount of loss caused by switching per unit time can be reduced.

Figure 13:
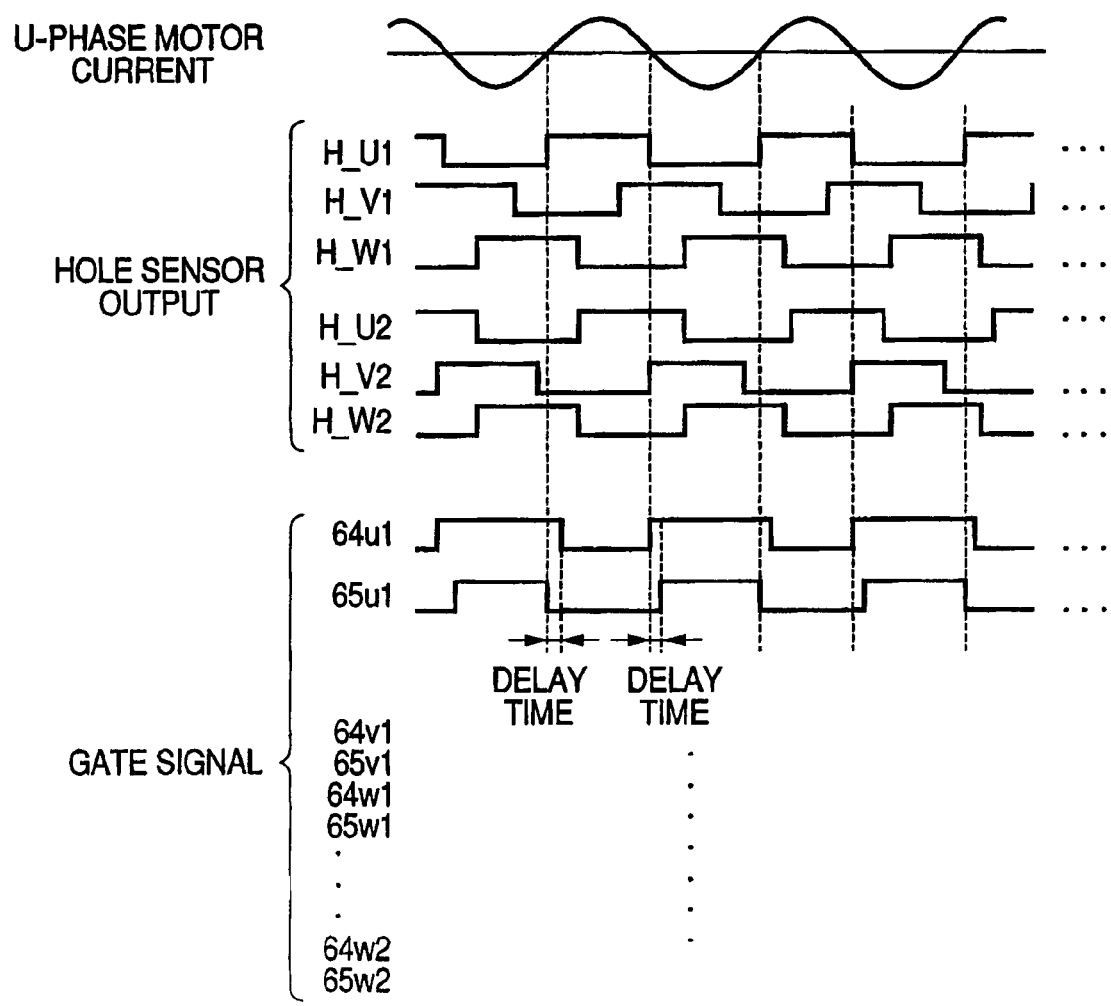
FIG. 13 is an explanatory diagram showing a system of driving a motor by subjecting the switching semiconductor device to one on/off operation in one cycle.

The system of driving the motor by bringing the switching semiconductor device in operation with one on/off per one cycle can be performed by the following control: controlling the gate voltage output of the switching semiconductor device in synchronism with the a hole sensor output that switches to high and low every 180° according to an angle between the rotor windings and the stator windings of the respective phases as shown in FIG. 3. In this example, the hole sensor can also serve as the rotation sensor 73. The hole sensor outputs H_U1, H_V1, and H_W1 shown In FIG. 13 have a relationship different in the phase by 120° with respect to the respective outputs. Also, a gate signal U1g1 becomes a gate off voltage due to the rising of the hole sensor output H_U1. And the gate voltage is controlled so as to generate the gate on-state voltage of the switching semiconductor device of the upper arm of the same phase after a delay time. In this example, the delay time is provided because the switching semiconductor devices of the upper and lower arms are prevented from turning on at the same time.

Figure 14:
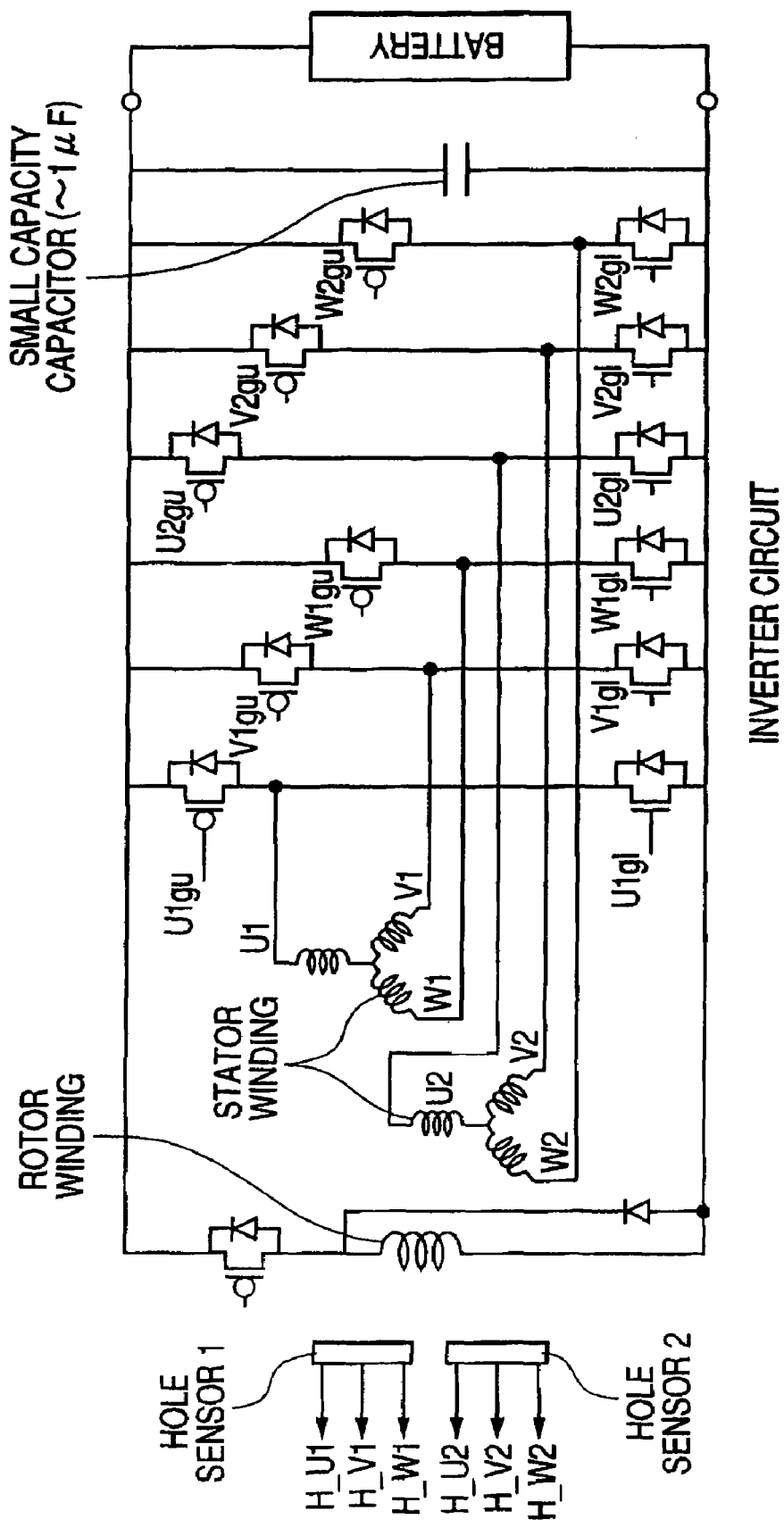
FIG. 14 is a circuit diagram showing the inverter device according to the embodiment of the present invention.

The application of the above motor drive system does not require the arrangement of the capacitor with a large capacity between the battery and the ground as shown in FIG. 14, and an inverter circuit can be constituted by provision of only a capacitor with a small capacity of about 1 μF which filters the noises from a direct current cable.

The above-mentioned motor-alternator 100 according to this embodiment has the following advantages.

Figure 15:
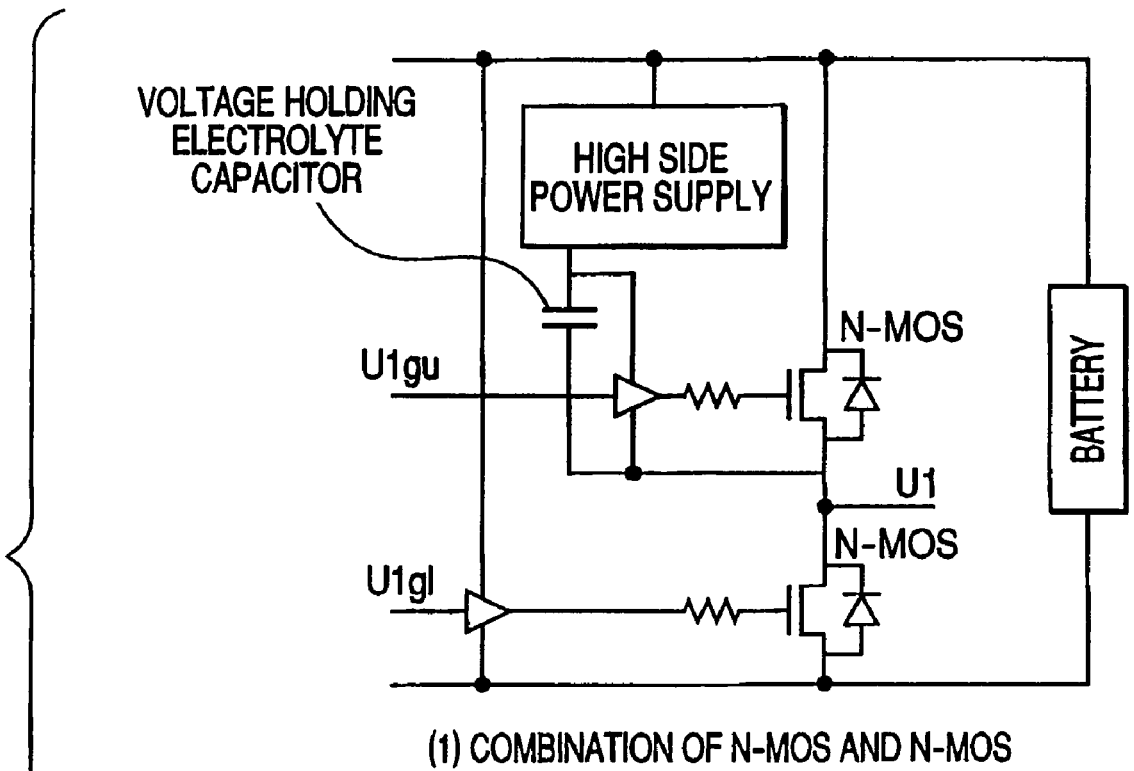
FIG. 15(1) is a circuit diagram in a case where an n-MOS and an n-MOS are combined together, and FIG. 15(2) is a circuit diagram in a case where a p-MOS and an n-MOS are combined together.
Figure 15:
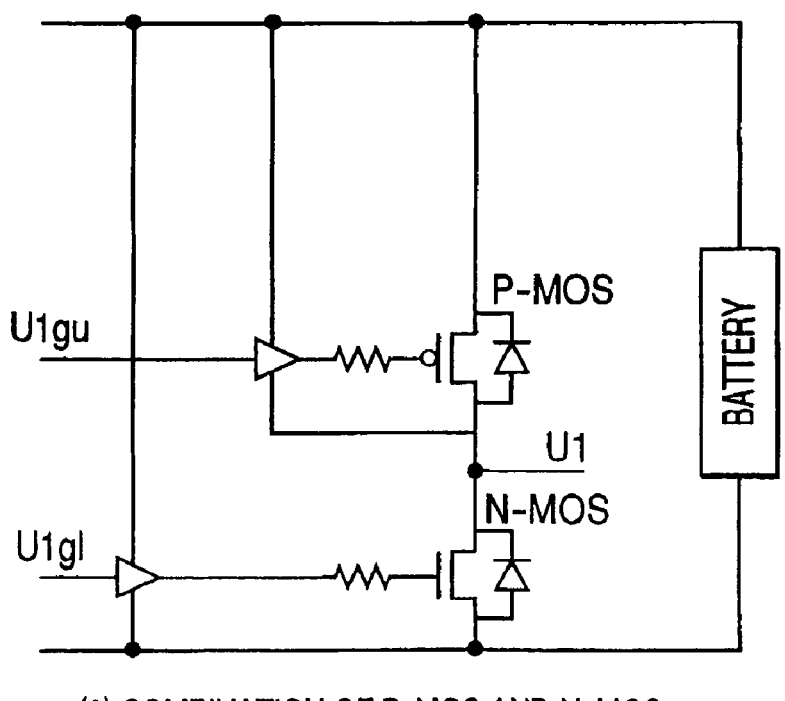

1) The driving power supply of the MOSFET and the electrolyte capacitor at the higher potential side are not required, and the mounting area can be reduced and the high temperature resistance can be improved (refer to FIG. 15).

2) The circuit mounted area of the converter circuit 55 can be reduced.

3) A reduction in the size of the semiconductor devices in the converter circuit 55 and a reduction in the costs can be effected by the heating reduction effect of the synchronous rectification.

4) The electronic circuit elements that constitute the control circuit 53 and the driver circuit 54 are integrated into the control IC 51, thereby making it possible to reduce the size.

5) The MP 53$d$, the RAM 53$m$ and the ROM 63$n$ are mounted on the control IC 51, thereby making it possible to suppress the costs and to flexibly deal with vehicles with different engines or different electric power generation systems.

6) The electrolyte capacitor with a large capacity which should be arranged between the battery and the ground is not required, and the inverter can be constituted by only a capacitor with a small capacity which filters the noises from a direct current cable, thereby making it possible to downsize the device.

Therefore, according to the motor-alternator 100 of this embodiment, the integration of the rotating electric machine body 1 with the inverter device 50 can be realized by substantially the same size as that of the normal vehicle alternator while the costs are suppressed.

In the background art of the present specification, there is described that parts which are simply mounted are necessary in spread of the idling stop system. The present invention provides the motor-alternator 100 having the inverter compatible with existing alternators, as a part necessary for realizing the idling stop system. The present invention is made to realize the idling stop system that is substantially identical with the existing vehicle layout, but when the present invention is considered as the system, it is necessary to combine the system with a lead battery that allows a large current output in a short period of time. For example, a current output from the battery 150 at the time of restarting the engine is about tenth of several seconds, and becomes 200 to 400 amperes of the same degree as that in the case where the engine starts due to the stator. When the battery voltage becomes equal to or less than 10 V in the battery voltage drop at the time of outputting a large current, there is a fear that the stable operation of a device such as an audio device or a car navigation system is impeded during that period. There is a method of arranging the lead batteries in parallel in order to prevent the voltage drop, but there arises a new problem on the assurance of the mounting space. This problem can be solved by a winding lead battery that is disclosed in, for example, Japanese Patent Application No. 2004-133693. The winding lead battery disclosed in the above Japanese Patent Application No. 2004-133693 has a performance that can hold the battery voltage to 10 V or higher at the time of outputting a large current in a short period of time with a volume that is equal to or less than that of the conventional lead battery. The combination of the winding lead battery with the motor-alternator of the present invention can provide an idling stop system that is substantially identical with the existing vehicle layout.

As described above, according to the present invention, even in a compact vehicle with a limited vehicle mounting space, the idling stop system can be realized without remarkably changing the layout within the engine room.

What is claimed is:

1. A vehicle rotating electric machine mounted on a vehicle and electrically connected to a vehicle power supply, the electric machine comprising:
a rotating electric machine body; and
a power converting device mounted on the rotating electric machine body,
wherein the power converting device comprises:
a module unit having a power control circuit, and
a control unit that controls the operation of the power control circuit,
wherein the power control circuit is configured by connecting a plurality of the following series circuits in parallel, each of the series circuits includes a P-channel MOS semiconductor device disposed at a higher potential side and an N-channel MOS semiconductor device disposed at a lower potential side which are electrically connected in series, and
the power control circuit controls a power that is supplied from a vehicle power supply or a power that is supplied to the vehicle power supply,
the control unit comprises:
a control circuit that outputs command signals for driving the P-channel MOS semiconductor devices and the N-channel MOS semiconductor devices, respectively; and
a driver circuit that outputs drive signals for driving the P-channel MOS semiconductor devices and the N-channel MOS semiconductor devices to those MOS semiconductor devices respectively upon receiving the command signals outputted from the control circuit.

2. The vehicle rotating electric machine according to claim 1, wherein the control circuit and the driver circuit are comprised of a plurality of electric circuit elements, respectively, and
the plurality of electric circuit elements are integrated and mounted on a substrate, and mounted on the rotating electric machine body.

3. The vehicle rotating electric machine according to claim 1, wherein the driver circuit operates to output the drive signals for driving the P-channel MOS semiconductor devices and the N-channel MOS semiconductor devices, respectively, to the P-channel MOS semiconductor devices and the N-channel MOS semiconductor devices, respectively, with the power that is supplied from the vehicle power supply as a power supply.

4. The vehicle rotating electric machine according to claim 1, wherein the rotating electric machine is mounted on an automobile which stops the internal combustion during stop of the automobile and restarts the internal combustion with the driving force of the rotating electric machine at the time of starting the automobile, and uses a vehicle electrical power supply for the rotating electric machine;
the rotating electric machine body mechanically connected to the internal combustion engine; and the control circuit is comprised of a plurality of electric circuit elements, its power source is a power supply where the power from the vehicle power supply is stepped down, and operates to output the command signals for driving the P-channel MOS semiconductor devices and the N-channel MOS semiconductor devices;

the driver circuit is comprised of a plurality of electric circuit elements, its power source is the vehicle power supply, and operates to output the drive signals for driving the P-channel MOS semiconductor devices and the N-channel MOS semiconductor devices to those MOS semiconductor devices respectively;

the plurality of electric circuit elements are integrated and mounted on a substrate, and mounted on the rotating electric machine body.

5. The vehicle rotating electric machine according to any one of claims 1, wherein the P-channel MOS semiconductor devices and the N-channel MOS semiconductor devices are field effect transistors, wherein each pair of the P-channel MOS semiconductor device and the N-channel MOS semiconductor device have a drain electrode thereof connected to conductors of the same potential, and are mounted on the conductors, and wherein the conductors are mounted on the rotating electric machine body in an electrically insulated state.

6. The vehicle rotating electric machine according to any one of claims 1, wherein the control unit comprises means for starting the rotating electric machine as an electric motor, and decreasing a field current that is supplied to a field winding of the rotating electric machine when the rotation speed of the rotating electric machine is equal to or more than a predetermined rotation speed.

7. The vehicle rotating electric machine according to claim 6, wherein the control unit includes memory means rewritable stored information, the memory means stores the predetermined rotation speed and a reduction ratio of the field current, and the predetermined rotation speed and the reduction ratio of the field current can be changed by rewriting the stored information of the memory means.

8. The vehicle rotating electric machine according to any one of claims 1, wherein the control unit comprises means for adjusting the operation speeds of the P-channel MOS semiconductor devices and the N-channel MOS semiconductor devices, and a memory device that stores information for setting the operation speed therein, and wherein the operation speed adjusting means adjusts the operation speeds of the P-channel MOS semiconductor devices and the N-channel MOS semiconductor devices according to the operation speed information from the memory device.

9. The vehicle rotating electric machine according to claim 5, wherein the conductor has one temperature sensing element for sensing the temperatures of the P-channel MOS field effect transistors and the N-channel MOS field effect transistors.

10. The vehicle rotating electric machine according to any one of claims 1, wherein the control unit is comprised of at least one chip in which a plurality of electronic circuit elements of constituting the control circuit and the driver circuit are integrated, the chip is electrically connected to the conductor and mounted on the conductor, and the conductor is mounted on an electrically conductive radiation member disposed on the rotating electric machine body in an electrically insulated state.

11. The vehicle rotating electric machine according to any one of claims 1, wherein a winding lead battery is used for the vehicle power supply.

\* \* \* \* \*